(12) United States Patent  
Vierow et al.

(10) Patent No.: US 7,057,878 B2  
(45) Date of Patent: Jun. 6, 2006

(54) DISCRETE COMPONENT ARRAY

(75) Inventors: William F. Vierow, Saco, ME (US); Dehart G. Scrantom, III, Conway, SC (US); Walter Koda, Brookfield, NH (US); Victor Martinez, El Paso, TX (US)

(73) Assignee: AVX Corporation, Myrtle Beach, SC (US)

( * ) Notice: Subject to any disclaimer, the term of this patent is extended or adjusted under 35 U.S.C. 154(b) by 410 days.

(21) Appl. No.: 10/409,024

(22) Filed: Apr. 8, 2003

(65) Prior Publication Data

US 2003/0231477 A1 Dec. 18, 2003

Related U.S. Application Data

(60) Provisional application No. 60/372,193, filed on Apr. 12, 2002.

(51) Int. Cl.  
*H01G 4/38* (2006.01)

(52) U.S. Cl. ............. 361/328; 361/301.3; 361/541

(58) Field of Classification Search ........... 361/301.3, 361/328, 517–519, 535–537, 541; 338/239, 338/235; 174/52.1  
See application file for complete search history.

(56) References Cited

U.S. PATENT DOCUMENTS

| | | | |
|---|---|---|---|
| 3,280,378 A | 10/1966 | Brady et al. | |
| 4,365,284 A | 12/1982 | Tanaka | |
| RE31,929 E | 6/1985 | Donaher et al. | |
| 4,672,511 A | 6/1987 | Meusel et al. | |
| 4,831,494 A | 5/1989 | Arnold et al. | |
| 4,853,827 A | * 8/1989 | Hernandez | ............... 361/321.4 |
| 5,307,240 A | 4/1994 | McMahon | |
| 5,367,437 A | 11/1994 | Anderson | |
| 5,377,073 A | * 12/1994 | Fukaumi et al. | ............ 361/540 |
| 5,428,499 A | * 6/1995 | Szerlip et al. | ............... 361/328 |
| 5,493,259 A | * 2/1996 | Blalock et al. | ............. 333/182 |
| 5,495,387 A | 2/1996 | Mandai et al. | |
| 5,548,473 A | * 8/1996 | Wang | ..................... 361/301.1 |
| 5,670,824 A | 9/1997 | Weinberg | |
| 5,754,405 A | 5/1998 | Derouiche | |
| 5,786,987 A | 7/1998 | Barbier et al. | |
| 5,936,840 A | 8/1999 | Satwinder | |
| 6,040,622 A | 3/2000 | Wallace | |
| 6,058,004 A | 5/2000 | Duva et al. | |
| 6,081,416 A | 6/2000 | Trinh et al. | |
| 6,091,145 A | 7/2000 | Clayton | |
| 6,097,611 A | 8/2000 | Samaras et al. | |
| 6,154,372 A | 11/2000 | Kalivas et al. | |
| 6,172,878 B1 | 1/2001 | Takabayashi et al. | |
| 6,243,605 B1 | 6/2001 | Youker et al. | |

* cited by examiner

*Primary Examiner*—Anthony Dinkins  
(74) *Attorney, Agent, or Firm*—Dority & Manning, P. A.

(57) ABSTRACT

Integrated passive component assemblies utilize array shell or array frame receiving structures to isolate and protect discrete passive components and provide a modular configuration for mounting to a substrate. Receiving structure embodiments include a base portion, spacer ribs, and optional side walls. Spacer ribs may be connected or provided in opposing spacer rib portions to effectively isolate adjacent component terminations. Standoff features may be incorporated into select embodiments of the disclosed technology to aid in device mounting and to facilitate post-affixment cleaning and visual termination contact. Discrete passive components in accordance with the present subject matter may include select combinations of resistors, capacitors, inductors, and other suitable devices.

32 Claims, 18 Drawing Sheets

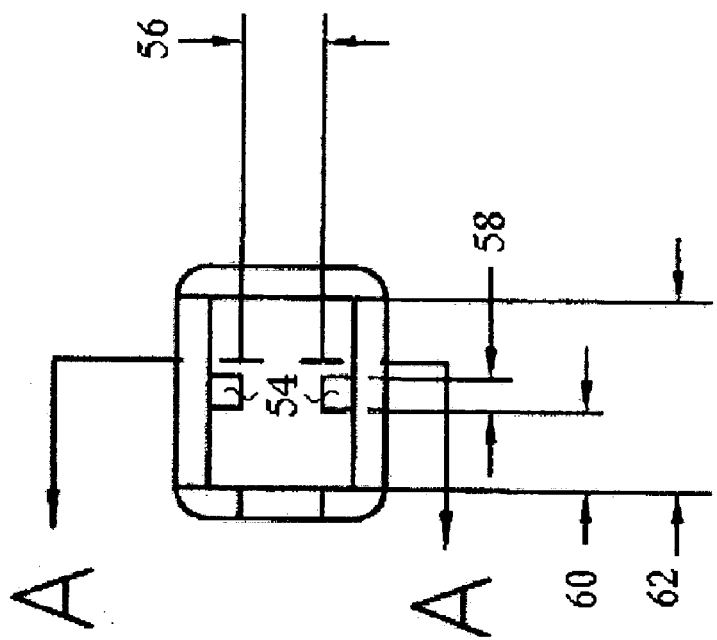
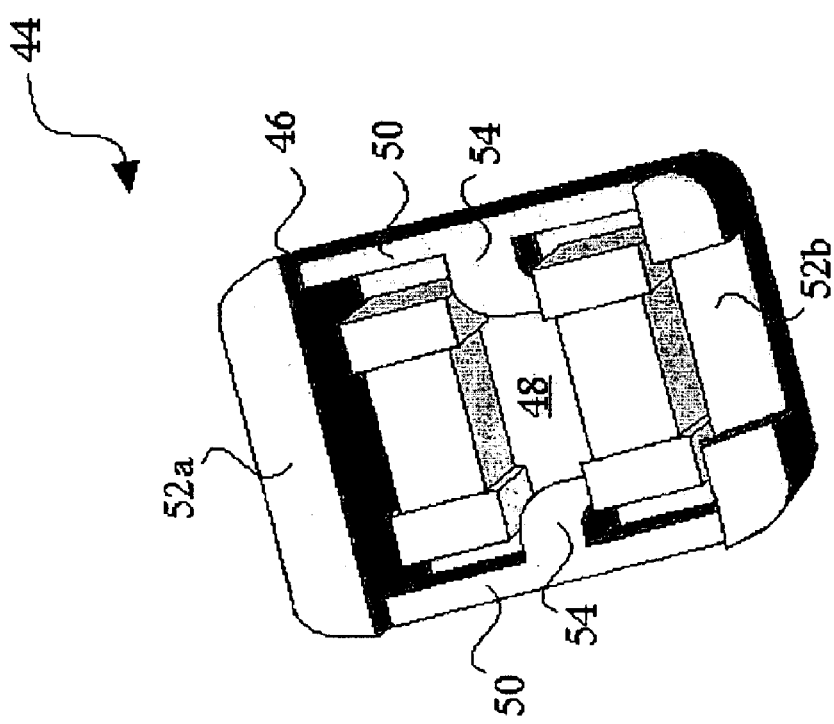
*Figure 3B*
*Figure 3A*

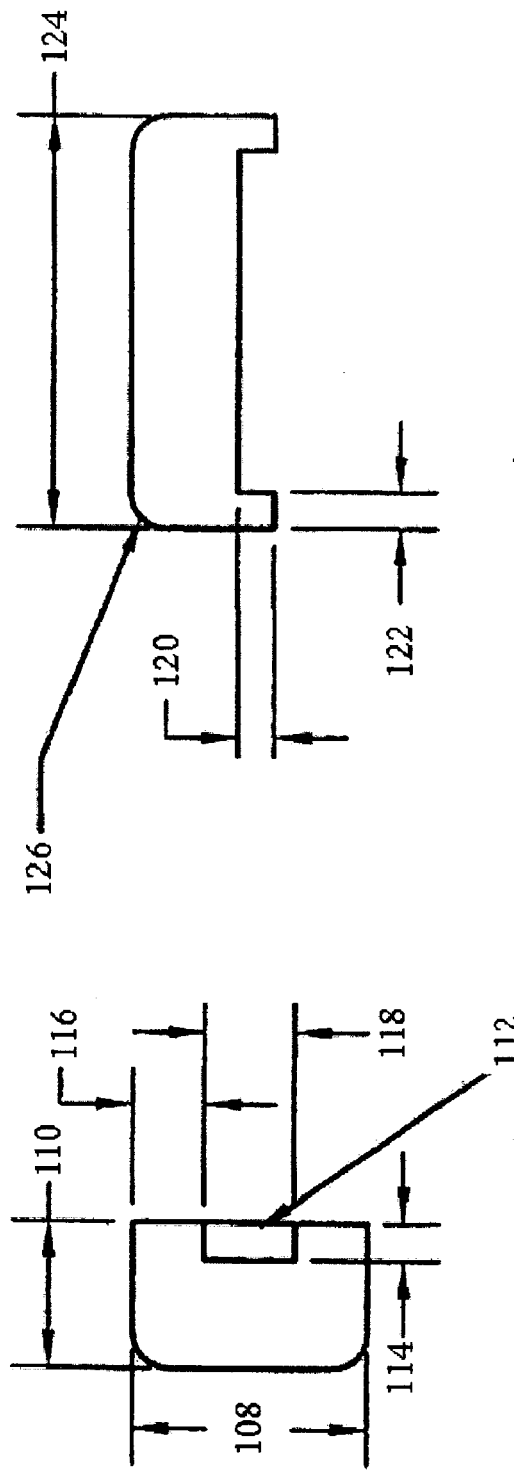
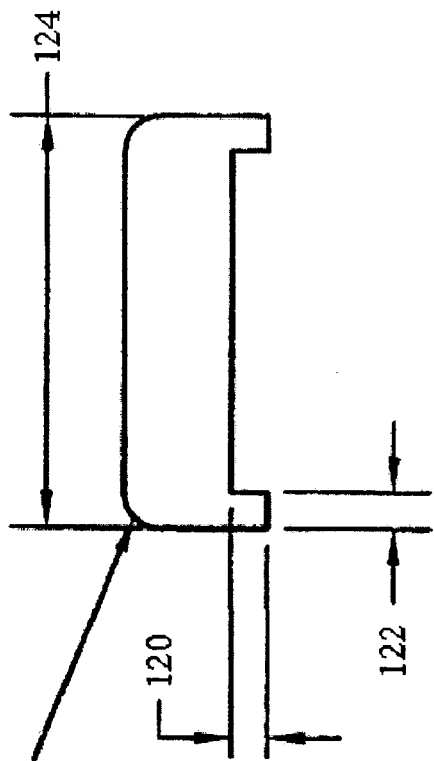
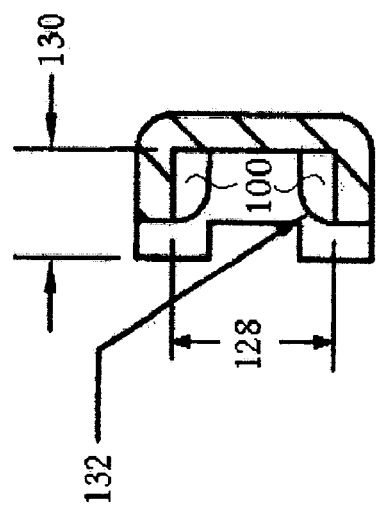
Figure 4D
Figure 4E
Figure 4C

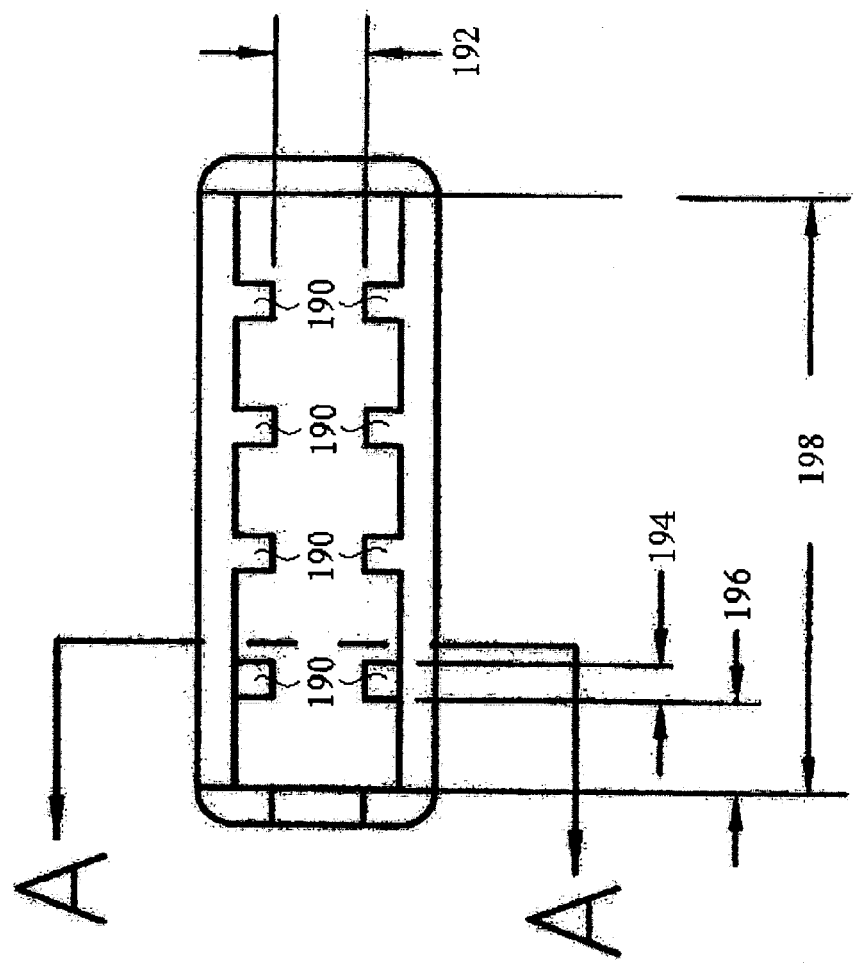
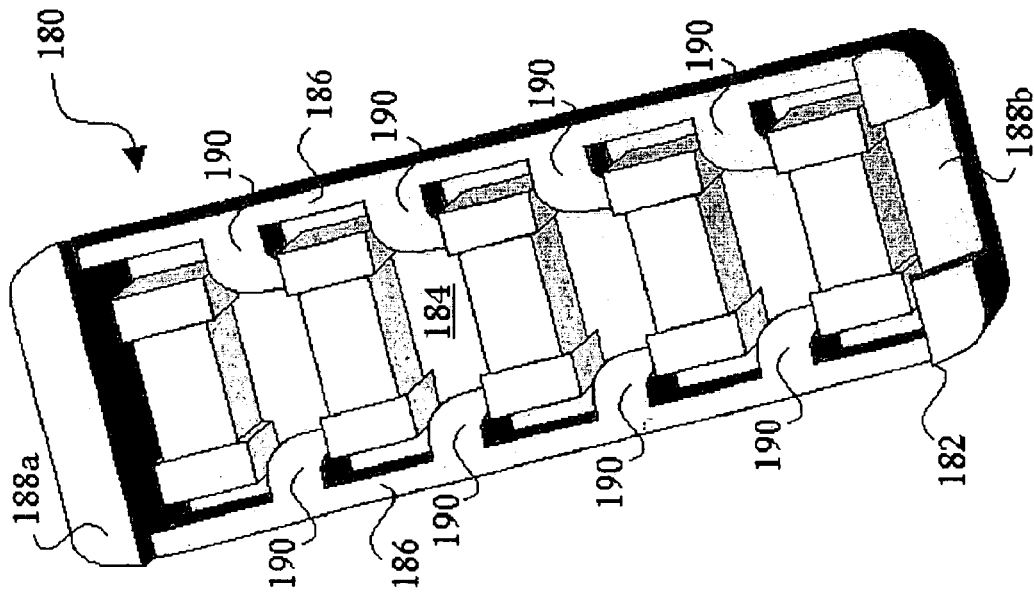
Figure 6B
Figure 6A

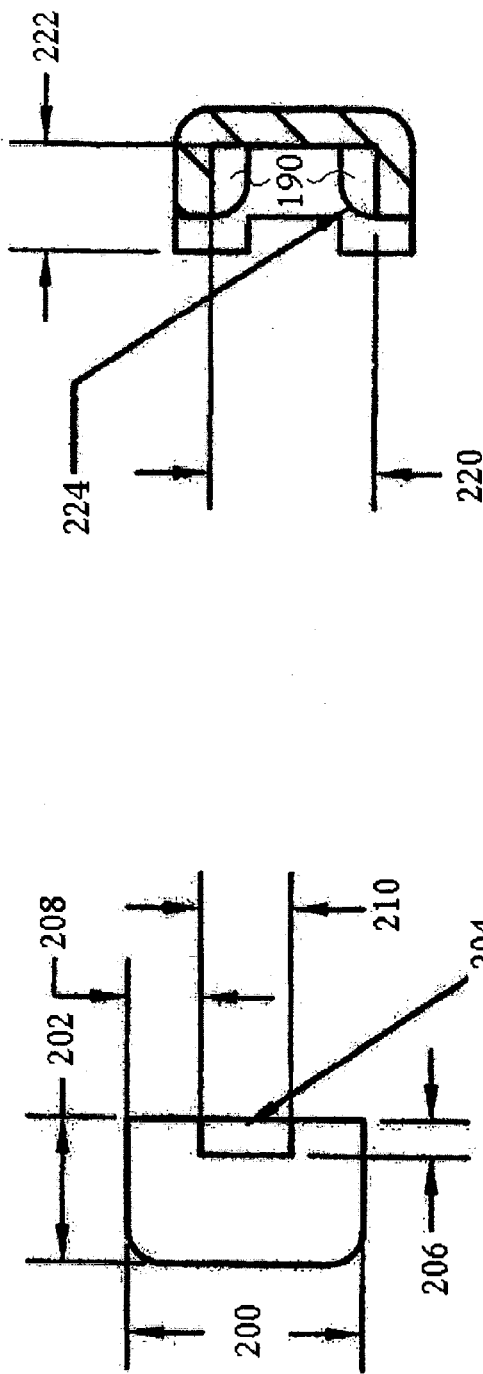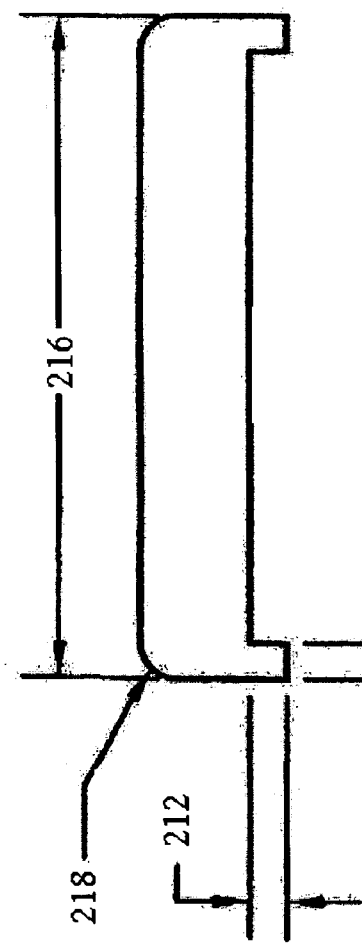

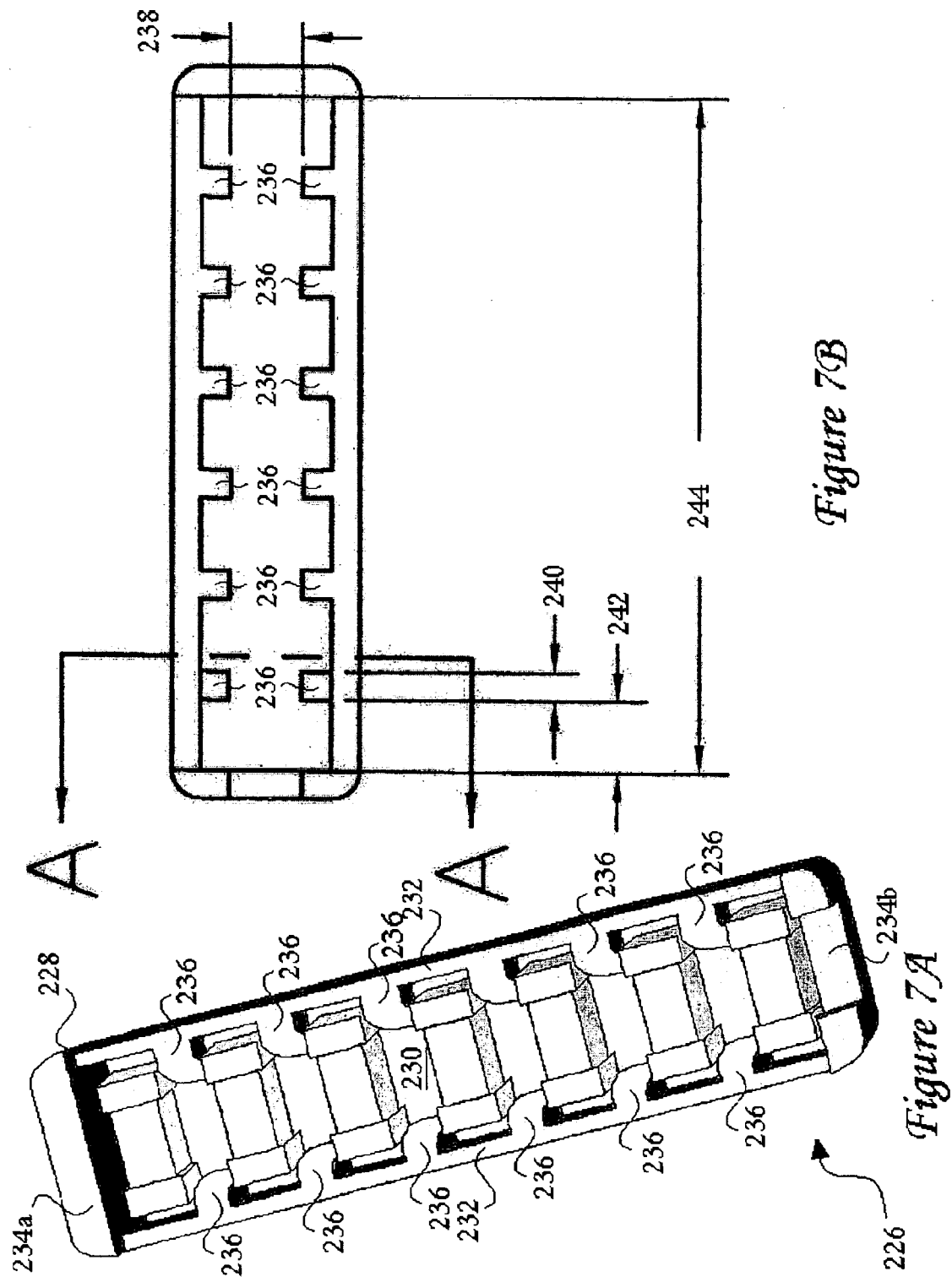

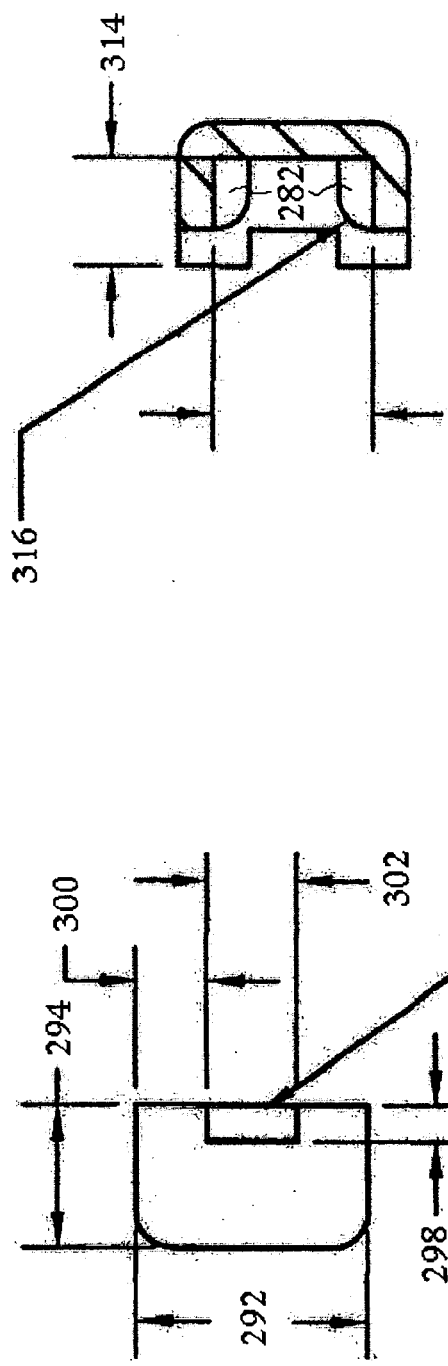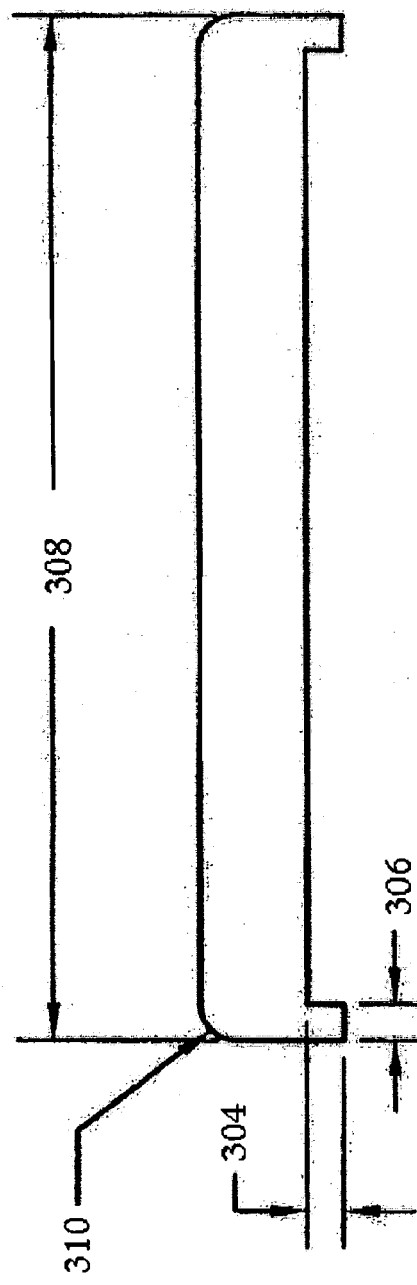

DISCRETE COMPONENT ARRAY

PRIORITY CLAIM

This application claims the benefit of previously filed U.S. Provisional Patent Application entitled "DISCRETE COMPONENT ARRAY," assigned U.S. Ser. No. 60/372,193, filed Apr. 12, 2002, and which is incorporated herein by reference for all purposes.

BACKGROUND OF THE INVENTION

The present subject matter generally concerns discrete electronic component arrays and improved integrated configurations of multilayer capacitors, resistors, inductors, and/or other passive components. The disclosed technology particularly involves receiving structures, such as encapsulated shells and array frames, which help combine multiple passive components in a single module for mounting to a substrate.

Many modern electronic devices provide a plurality of components as an in-line combination or configured array. The provision of multiple components in a single embodiment facilitates the use of such a multi-component device in a variety of fashions. For instance, each individual component in such a capacitor array could be used to provide capacitance in different circuit locations, for varied purposes, and even with different capacitance values. Alternatively, multiple capacitors in a capacitor array could be connected in parallel and utilized in combination to provide a single capacitive element with increased capacitance value. U.S. Pat. No. 4,831,494 (Arnold et al.) discloses a multilayer capacitor such as one that may be used in such a capacitor array. Examples of combinations of multiple electronic components within a unified configuration are disclosed in U.S. Pat. No. 6,243,605 (Youker); U.S. Pat. No. 5,936,840 (Satwinder); and U.S. Pat. No. 4,365,284 (Tanaka).

When multiple components are provided in a single embodiment, it may often be desirable to incorporate different types of components. Integrated passive components are known to incorporate combinations of components such as resistors, capacitors, and/or inductors into a single electronic device. Such a diverse combination provides versatility for the type of circuit application with which a single device can be employed. Exemplary integrated passive component combinations can be found in U.S. Pat. No. 6,058,004 (Duva et al.) and U.S. Pat. No. 5,495,387 (Mandai).

A variety of methods are known that facilitate the combination of multiple components within a single electronic device. Some of these methods focus on unique termination arrangements or electrical connections among combined components. U.S. Pat. No. 6,172,878 (Takabayashi); U.S. Pat. No. 5,367,437 (Anderson); U.S. Pat. No. 4,672,511 (Meusel et al.); and Re. 31,929 (Donaher et al.) provide examples of multi-component modules with particular electrical connection features. Other electrical component arrays utilize mechanical features, such as moldings or mounting frames, to facilitate the combination of components within a single embodiment. Examples of electronic components with particular mechanical structures include U.S. Pat. No. 6,154,372 (Kalivas et al.); U.S. Pat. No. 6,097,611 (Samaras et al.); U.S. Pat. No. 6,091,145 (Clayton); U.S. Pat. No. 6,081,416 (Trinh); and U.S. Pat. No. 5,307,240 (McMahon). Still further examples of electrical components with particular array configurations are disclosed in U.S. Pat. No. 6,040,622 (Wallace) and U.S. Pat. No. 3,280,378 (Brady et al.).

Additional background references regarding electronic components technology include U.S. Pat. No. 5,786,987 (Barbier et al.); U.S. Pat. No. 5,754,405 (Derouiche) and U.S. Pat. No. 5,670,824 (Weinberg).

The disclosures of all the foregoing United States patents are hereby fully incorporated into this application for all purposes by reference thereto.

BRIEF SUMMARY OF THE INVENTION

The present subject matter recognizes and addresses various shortcomings and other limitations concerning certain aspects of electronic component technology. Thus, broadly speaking, a principal object of the presently disclosed technology is improved integration of passive electronic components. More particularly, the disclosed technology relates to mechanical structures for receiving a plurality of discrete passive components and combining them into a single module for mounting to a substrate.

Another principal object of the presently disclosed technology is to provide a discrete component array that enables the placement of multiple passive elements with generally similar dimensions in linear or array configurations. Such multi-component configurations are then preferably mounted to a printed circuit board or other substrate using a relatively smaller footprint as would be compared to individually mounting such components.

Another object of the present subject matter is to provide an encapsulated shell module in accordance with a discrete component array that optionally provides standoff features to aid in mounting of the device. Such a standoff feature may provide additional advantages, including improved termination troubleshooting and easier post affixment component cleaning.

Yet another object of the present subject matter is to provide a discrete component array that accommodates a diverse range of component functionality. Different embodiments of the present technology can incorporate varied combinations of different capacitor, resistor, and/or inductor components in a single modular package.

A still further object of the presently disclosed technology is to provide a mechanical isolation structure for use in accordance with discrete component arrays that offers improved mechanical protection of the discrete components. Particular aspects of such an isolation structure preferably further aid in reducing the possibility of undesired termination bridging among discrete components in a component array.

Yet another object of the presently disclosed technology is to provide discrete component arrays that are compatible with a variety of different electrical connections, termination features and mounting configurations. Examples of such features may include conductive termination jumpers, ball grid array (BGA) solder attachments and conductive adhesive pads.

A still further object of aspects of the disclosed technology is to provide discrete component arrays that are compatible with a variety of electronic applications, including implantable medical devices, hearing aids, weapons systems, and others.

Additional objects and advantages of the invention are set forth in, or will be apparent to those of ordinary skill in the art from, the detailed description herein. Also, it should be further appreciated by those of ordinary skill in the art that modifications and variations to the specifically illustrated, referenced, and discussed features hereof may be practiced in various embodiments and uses of the disclosed technology without departing from the spirit and scope thereof, by virtue of present reference thereto. Such variations may include, but are not limited to, substitution of equivalent means and features, or materials for those shown, referenced, or discussed, and the functional, operational, or positional reversal of various parts, features, or the like.

Still further, it is to be understood that different embodiments, as well as different presently preferred embodiments, of this invention may include various combinations or configurations of presently disclosed features or elements, or their equivalents (including combinations of features or configurations thereof not expressly shown in the figures or stated in the detailed description). A first exemplary embodiment of the present subject matter relates to an array shell for receiving a plurality of discrete passive components and for providing mechanical protection for and isolation among such passive components.

More particularly, such an exemplary array shell may comprise a generally rectangular base portion, a plurality of side walls, and a plurality of spacer ribs. The side walls preferably extend from the periphery of the base portion in a generally perpendicular direction relative to the base portion, forming an open box configuration. The spacer ribs then preferably extend from selected locations along the interior of selected side walls. Spacer ribs may span the entire length or width of the array shell by connecting from a selected side wall interior to the side wall interior opposing the selected side wall. Alternatively, opposing spacer ribs may extend from opposing side wall locations without connecting in the middle and spanning an entire length or width of the array shell. Independent of the actual spacer rib configuration, each connected spacer rib or opposing set of spacer ribs preferably is generally parallel to two selected side walls of the subject array shell. The height of each side wall and spacer rib in array shell embodiments in accordance with the present technology may vary depending on the desired electronic component application or other variable aspects of given embodiments.

More particular exemplary array shell embodiments, including selected features as described above, may incorporate a specific number of spacer ribs depending on the number of passive components to be fitted within the shell. For instance, at least one connected spacer rib or one set of opposing spacer ribs are preferred in the formation of an array shell embodiment for receiving two discrete passive components. At least four connected spacer ribs or four sets of opposing spacer ribs are preferred for a linear array shell embodiment for receiving five discrete passive components. For non-linear array configurations, such as a five-by-two component array, additional spacer ribs in accordance with the present subject matter are typically included.

Additional features or alternative configurations may be incorporated into the exemplary array shell embodiments as described above. For example, standoff extensions may be provided at selected side wall or spacer rib locations to increase the height of selected side wall or spacer rib portions of the array shell. Such standoff features in accordance with the present technology may facilitate component mounting to a substrate or facilitate post-affixment cleaning.

Yet another exemplary embodiment of the present subject matter concerns an array frame configuration for receiving and providing separation among discrete passive components. Such an array frame preferably comprises a base portion and a plurality of spacer ribs combined to form a grid-like divider configuration. The divider frame may be configured for linear or non-linear component arrays. The height of each spacer rib in the configuration may vary depending on intended applications, and standoff elements may be added in accordance with selected spacer ribs to further facilitate component mounting to a substrate.

A still further exemplary embodiment of the presently disclosed technology relates to a discrete capacitor array comprising a mechanical receiving structure and a plurality of discrete capacitive components. The mechanical receiving structure may correspond to either an array shell or array frame configuration, and provides separate receiving areas for each discrete capacitor of the capacitor array. A select combination of base portions, side walls and spacer ribs in each receiving structure offers isolation among and structural protection for the capacitors. Discrete capacitors within such an exemplary capacitor array may correspond to multilayer ceramic capacitors (MLCs), tantalum capacitors, or other capacitors. Every capacitor in an array may be characterized by the same capacitance, or alternatively be characterized by varied capacitance values.

Yet another exemplary embodiment of the presently disclosed technology concerns a passive electronic device comprising a mechanical receiving structure, a plurality of discrete passive components, a plurality of epoxy attachment layers, and a plurality of affixment features. The receiving structure preferably comprises a base portion and a plurality of spacer ribs and provides a receiving framework for isolating discrete passive components within the passive electronic device. Side walls may also be incorporated into some exemplary receiving structure embodiments. Epoxy attachment layers are preferably used to securely position the discrete passive components within the receiving structure. Discrete passive components may comprise any select combination of capacitors, resistors, inductors, or other passive elements, with particular combinations of components often chosen based on a potential electronic application. Each passive component is preferably positioned within the receiving structure such that termination locations are exposed on at least one selected side of the electronic component. Metallization features are then preferably provided to each termination location of each passive component either to connect a termination location to another termination location within the electronic component or to facilitate mounting of the electronic component to bond pads or trace locations on a printed circuit board.

Additional embodiments of the present subject matter, not necessarily expressed in this summarized section, may include and incorporate various combinations of aspects of features or parts referenced in the summarized objectives above, and/or features or parts as otherwise discussed in this application.

Those of ordinary skill in the art will better appreciate the features and aspects of such embodiments, and others, upon review of the remainder of the specification.

BRIEF DESCRIPTION OF THE SEVERAL VIEWS OF THE DRAWING

A full and enabling description of the present subject matter, including the best mode thereof, directed to one of ordinary skill in the art, is set forth in the specification, which makes reference to the appended figures, in which:

FIG. 3A provides an isometric view with generally bottom and slight side perspective of an exemplary two-by-one discrete component array embodiment in accordance with the disclosed technology;

FIG. 3B provides a bottom view of the exemplary two-by-one discrete component array embodiment of FIG. 3A;

FIG. 4C provides a first side view of the exemplary three-by-one discrete component array embodiment of FIG. 4A;

FIG. 4D provides a second side view of the exemplary three-by-one discrete component array embodiment of FIG. 4A;

FIG. 4E provides a side sectional view of the exemplary three-by-one discrete component array embodiment of FIGS. 4A through 4D taken along planar section line A—A in FIG. 4B;

FIG. 6A provides an isometric view with generally bottom and slight side perspective of an exemplary five-by-one discrete component array embodiment in accordance with the disclosed technology;

FIG. 6B provides a bottom view of the exemplary five-by-one discrete component array embodiment of FIG. 6A;

FIG. 6C provides a first side view of the exemplary five-by-one discrete component array embodiment of FIG. 6A;

FIG. 6D provides a second side view of the exemplary five-by-one discrete component array embodiment of FIG. 6A;

FIG. 6E provides a side sectional view of the exemplary five-by-one discrete component array embodiment of FIGS. 6A through 6D taken along planar section line A—A in FIG. 6B;

FIG. 7A provides an isometric view with generally bottom and slight side perspective of an exemplary seven-by-one discrete component array embodiment in accordance with the disclosed technology;

FIG. 7B provides a bottom view of the exemplary seven-by-one discrete component array embodiment of FIG. 7A;

FIG. 8C provides a first side view of the exemplary eight-by-one discrete component array embodiment of FIG. 8A;

FIG. 8D provides a second side view of the exemplary eight-by-one discrete component array embodiment of FIG. 8A;

FIG. 8E provides a side sectional view of the exemplary eight-by-one discrete component array embodiment of FIGS. 8A through 8D taken along planar section line A—A in FIG. 8B;

Figure 1A:
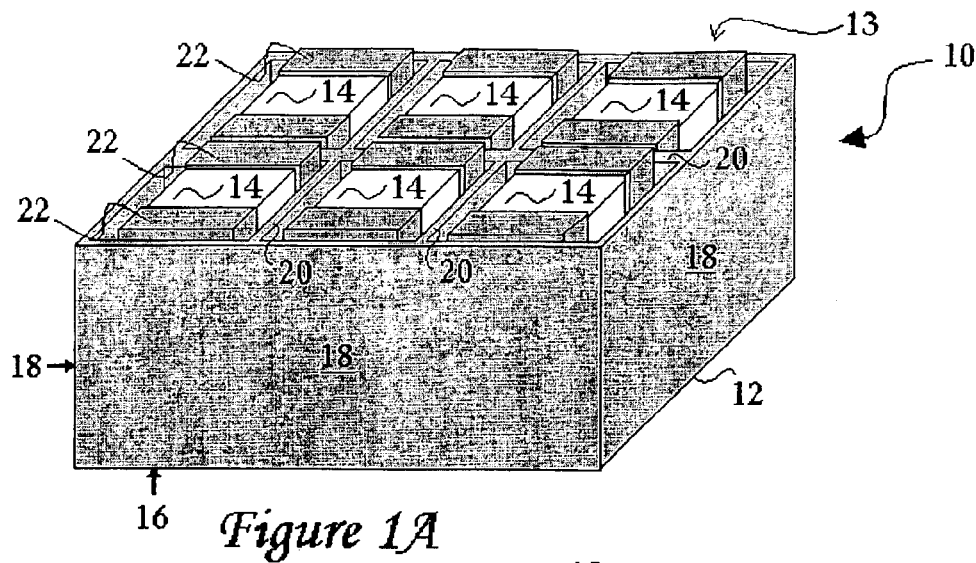
FIG. 1A provides a generally side view with slight bottom perspective of an exemplary discrete component array embodiment with an array shell and connected side ribs in accordance with the present subject matter.

Repeat use of reference characters throughout the present specification and appended drawings is intended to represent same or analogous features or elements of the invention.

DETAILED DESCRIPTION OF THE EMBODIMENTS

As referenced in the Brief Summary of the Invention section, the present subject matter is directed towards improved integration of passive electronic components. More particularly, the disclosed technology relates to encapsulation mechanisms such as array frames and array shells for receiving a plurality of discrete passive components and combining them into a single module for mounting to a substrate.

Figure 1B:
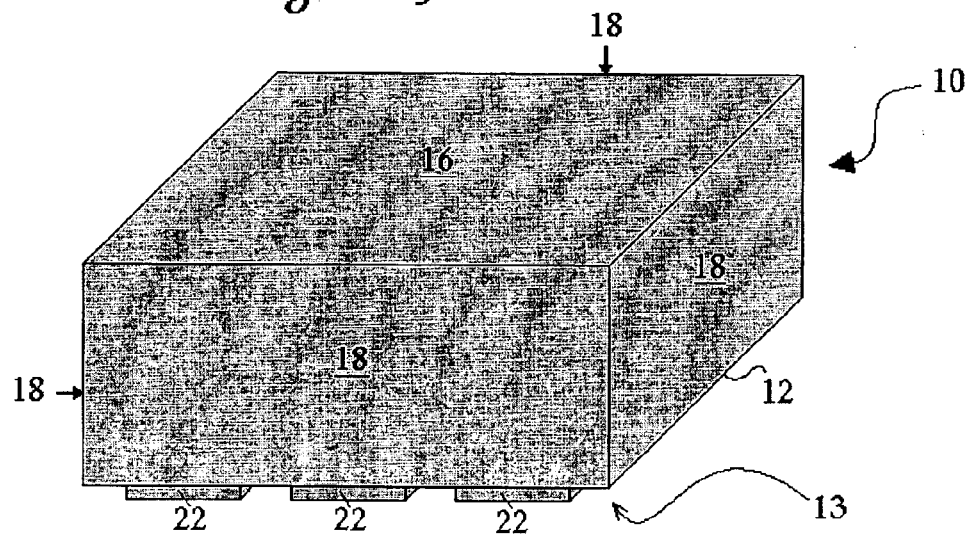
FIG. 1B provides a generally side view with slight top perspective of an exemplary discrete component array embodiment with an array shell and exemplary mounting features in accordance with the present subject matter, in exploded position relative to an exemplary substrate.
Figure 1B:
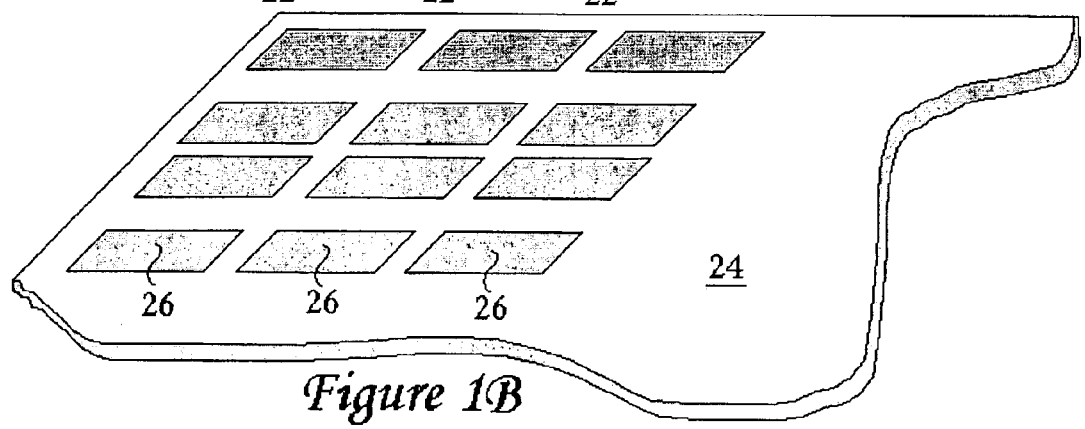
Figure 2A:
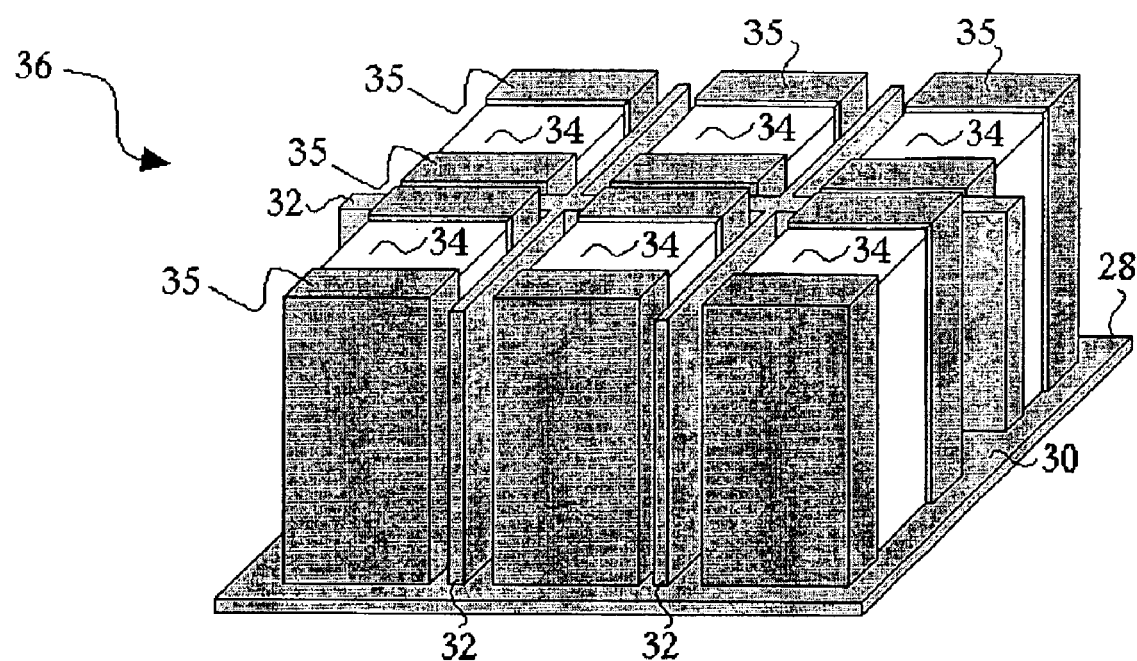
FIG. 2A provides a generally side view with slight bottom perspective of an exemplary discrete component array embodiment with an array frame and connected side ribs in accordance with the present subject matter.
Figure 2B:
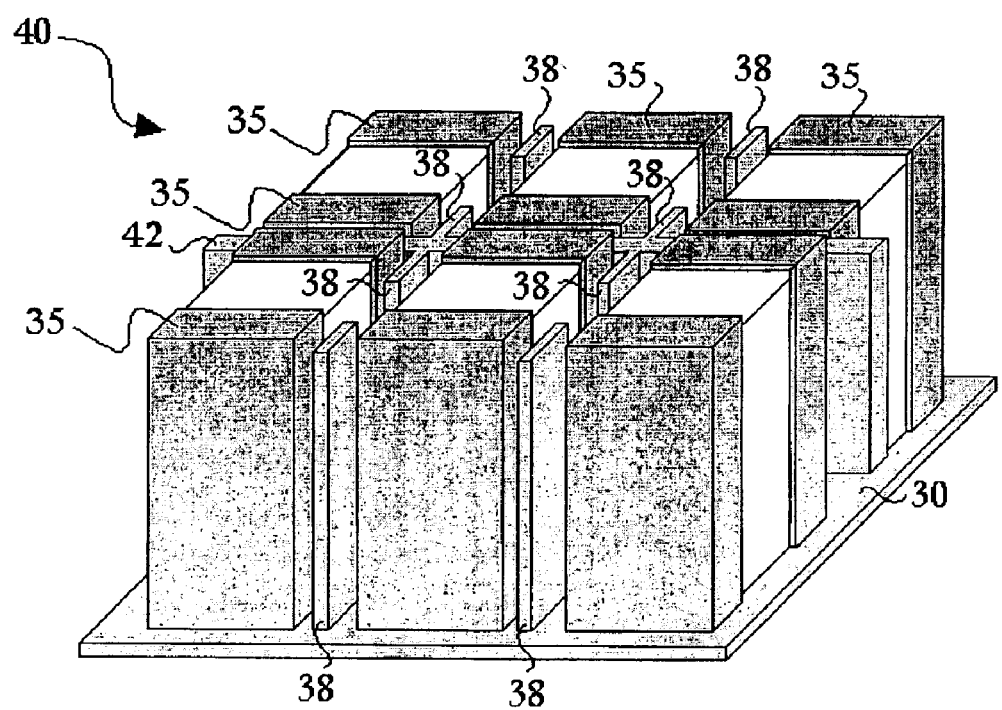
FIG. 2B provides a generally side view with slight bottom perspective of an exemplary discrete component array embodiment with an array frame and opposing side ribs in accordance with the present subject matter.

A discussion of the exemplary embodiments of the present subject matter, with reference to the figures, is hereafter presented with initial focus on the different general types of mechanical isolation structures, or receiving structures. Two particular types of receiving structures relate to array shells and array frames. FIGS. 1A and 1B display exemplary discrete component arrays with array shell structures, and FIG. 1B illustrates exemplary affixment features for mounting such a component array to a substrate. FIGS. 2A and 2B display exemplary discrete component arrays with array frame structures. Many more particular embodiments of the present subject matter are then presented with respect to FIGS. 3A through 9E, respectively. These embodiments relate to discrete component arrays with array shell isolation structures designed for receiving particular selected numbers of discrete components.

It should be noted that each of the exemplary embodiments as presented herein should not insinuate limitations of the disclosed technology. Features illustrated or described as part of one embodiment can be used in combination with another embodiment to yield further embodiments. Additionally, certain features may be interchanged with similar devices or features not mentioned yet which perform the same or similar function. Also, some embodiments may involve select arrangements and numbers of discrete components not expressly shown or discussed.

Now, with reference to the drawings, FIGS. 1A and 1B illustrate an exemplary discrete component array 10 with an array shell receiving structure 12. FIG. 1A is a generally side view with slight bottom perspective and FIG. 1B is a generally side view with slight top perspective of the same discrete component array 10. It should be appreciated that references herein to particular top, bottom, and side portions and views of the subject discrete component arrays is utilized for the sake of convenience, and should in no way insinuate limitations regarding possible orientation of the devices nor any substrates or other components with which they may become associated. In general, the side of a component referenced herein as the bottom side 13 is intended to correspond with the side of the component that is typically mounted to a printed circuit board or other substrate.

Such an array shell 12 generally provides a mechanical structure for receiving a plurality of monolithic passive components 14 and for providing isolation among the components and their respective terminations 22. Such array shell 12 comprises a base portion 16, a plurality of side walls 18, and a plurality of spacer ribs 20. Examples of typical termination materials include silver, tin, nickel, gold, and/or select combinations of the aforementioned materials. In addition, it should be appreciated that the disclosed technology is readily adaptable to incorporation with any termination type or material as recognized by the Electronic Industries Association (EIA). Generic examples of suitable materials for array shell 12 include plastics or ceramics with high heat-resistance characteristics. A specific example of a suitable material is a XYDAR brand polymer, for instance XYDAR FC110, such as that offered for sale by Amoco Polymers Inc.

The array shell embodiment of FIG. 1A is configured such that base portion 16 is generally rectangular in shape. A generally rectangular base portion readily accommodates the receipt of either a linear array (stack) of components or a non-linear array of components. A linear array in accordance with the present subject matter corresponds to an m-by-n array of discrete components where either m or n equals one. A non-linear array in accordance with the present subject matter corresponds to an m-by-n array of components where m and n are each greater than one. Although the discrete component arrays disclosed herein refer to generally rectangular component arrays, it should be appreciated that the disclosed technology can readily be applied to receiving structures and corresponding component array embodiments that do not correspond to rectangular configurations. A base portion with any size or shape can be designed with extended side walls and spacer ribs to provide the same advantages as the exemplary embodiments disclosed herein.

With further reference to exemplary discrete component array 10 of FIGS. 1A and 1B, side walls 18 extend from the periphery of base portion 16 in a generally perpendicular fashion with respect to base portion 16. With a rectangular base portion 16, four side walls 18 are preferably included. Spacer ribs 20 generally extend from interior locations of side walls 18 to form an internal isolation grid arrangement for receiving components 14. In general, an m-by-n component array has spacer ribs along $(m-1)+(n-1)$ different planes to offer improved isolation among discrete components. For example, in the three-by-two array of FIG. 1A, spacer ribs in $(3-1)+(2-1)=3$ different planes offer isolation among the discrete components. Each spacer rib 20 is generally parallel to two side walls 18 of the generally rectangular array shell 12 in discrete component array 10.

Given a particular design for array shell 12, discrete passive components 14 are preferably mounted in respective receiving locations and securely affixed within array shell 12 with the application of epoxy layers or other suitable adhesive materials. Passive components 14 are preferably positioned in array shell 12 such that termination locations are accessible at the side opposite the base portion 16, which side is presently referred to for convenience as bottom side 13.

Many discrete passive components are characterized by two opposing terminations 22 such as the passive components in FIG. 1A. An example of how component array 10 can be mounted to a printed circuit board or substrate 24 is depicted in FIG. 1B. A plurality of conductive pads 26 can be positioned on substrate 24 to match the positions of terminations 22 of discrete component array 10. Device 10 can then be properly aligned to the matching pads 26 on substrate 24 and fired to cure the component and establish intended electrical connections. In accordance with component attachment via conductive adhesive or epoxy pads, it may be preferred that terminations 22 correspond to terminations with gold plating or other suitable material.

Additional affixment features may be used in accordance with the disclosed technology to facilitate desired mounting techniques, such as ball grid array (BGA) configurations. In such a case, solder preforms may be positioned at selected termination locations 22 of array 10, then properly positioned and fired to reflow the solder preforms and effect the desired electrical connections to discrete components 14. In accordance with component attachment that utilizes solder reflow technology, it may be preferred that terminations 22 include silver, tin, nickel, or other alloy for termination plating.

The existence of array shell 12, and especially the provision of spacer ribs 20, offers isolation among the components when being mounted to substrate 24. By helping to maintain isolated position among discrete components, the possibility of undesired termination bridging among discrete components 14 is reduced. When conductive adhesives are utilized in accordance with the subject array embodiments, array shell 12 also helps prevent bridging due to adhesive smear. At the same time, the device 10 can be mounted to substrate 24 using a relatively smaller footprint as would be compared to mounting each discrete component 14 individually.

Another option related to the electrical connections to components 14 of component array 10 is to provide connections among selected discrete components within the array 10. For instance, conductive shunt bars or jumpers (not shown in such figures) may be positioned above the terminations of selected components 14 in component array 10 such that the devices may be utilized in combination. As such, each passive component 14 may be utilized in a given application as an individual component or in select combination with other components in the array 10.

It should be recognized that other termination features and connection arrangements may be provided for the discrete passive components utilized in accordance with the present subject matter without departing from the spirit and scope of the disclosed technology. There are also many variations of the type of passive components utilized in the subject component arrays. For example, passive components 14 may correspond to capacitors, inductors, resistors, other further passive components, and combinations thereof.

For example, passive components 14 may all correspond to multilayer ceramic capacitors to create a discrete capacitor array configuration. Each component can also be characterized by the same or different component values. For instance, multiple multilayer ceramic capacitors (MLCs) with different numbers of active layers or different dielectric compositions could provide a plurality of MLCs of similar size but with different capacitance values, per practice of the present subject matter. An example of capacitance values in accordance with certain embodiments of the present technology includes a range from about one nF to about ten nF. Other specific values may also be preferred for certain applications. In general, each discrete passive component is preferably about the same standard size as recognized by the Electronic Industries Association (EIA). This facilitates the formation of a component array with the same standard pitch between components.

There are many optional embodiments for the receiving structure that isolates the discrete components 14 in array 10. The exemplary embodiment 12 of FIGS. 1A and 1B includes side walls and spacer ribs of generally similar height. In other exemplary embodiments, the height of the side walls 18 is shorter compared to the height of the internal spacer ribs 20. This option of shortening the sides walls 18 of structure 12 can be practiced in different degrees. It is possible to reduce the height of side walls 16 completely to create an array frame receiving structure 28 such as displayed in FIG. 2A. Such an array frame 28 typically comprises a base portion 30 and spacer ribs 32. Spacer ribs 32 extend in a generally perpendicular fashion from base portion 30 to provide an isolation grid and receiving structure for a plurality of discrete passive components 34. Again, discrete passive components 34 can each be selected from a variety of different capacitor, inductor, and/or resistor components.

Another option in the design of a receiving structure in accordance with the present subject matter is that the spacer ribs 32 in certain instances need not span the entire length or width of component array 36. Portions of a spacer rib 32 such as shown in FIG. 2A can be eliminated where terminations 35 of discrete passive components 34 are not prevalent. Elimination of portions of a connected spacer rib 32 yields a configuration of opposing spacer rib portions 38 as shown in FIG. 2B. Since the component array 40 of FIG. 2B is a non-linear array and due to the particular termination configuration, it is preferred that spacer rib 42 extend across the entire width of the device. Although different combinations of connected spacer ribs 42 and opposing spacer rib portions 38 may be utilized, an important design goal corresponds to the provision of spacer ribs to help isolate the terminations 35 among discrete components.

Employment of either an array shell receiving structure or an array frame receiving structure may vary depending on particular design preferences and electronic applications. An array shell offers more mechanical protection and encapsulation for the discrete components in an array. Such aspect becomes a particular advantage during part placement on a circuit board. An array frame, however, facilitates termination troubleshooting by offering visual contact to the discrete components and their termination and mounting features. As such, termination mounting and troubleshooting per the present technology is better enabled with array frame receiving structures and array shell embodiments with shortened side walls.

Another option that can be incorporated into embodiments of the present technology is a standoff feature added to a receiving structure at selected side wall or spacer rib locations. Such standoff features, as are present in the exemplary embodiments of FIGS. 3A through 9E, respectively, offer additional advantages to the present subject matter. Standoffs generally aid in mounting a discrete component array, and can keep the passive components off of a circuit board. Such standoffs further reduce the possibility of inter-component termination bridging. By extending a component array above a circuit board, standoffs additionally aid the process of post-affixment component cleaning. Suitable solvents can be utilized to more readily clean the passive components and ensure more reliable performance characteristics of the device.

Yet another advantage that standoff features provide in specific embodiments of the present technology is additional securing of a component array to a circuit board. By having indentations in a circuit board that match the standoffs of a component array, the electronic device can be locked into place on the circuit board. This may result in the passive components being flush with the substrate to which the component array is mounted.

It should now be understood that a variety of different embodiments of the invention may be practiced in accordance with the disclosed technology. Much of the variety among the subject discrete component arrays corresponds to different receiving structure configurations. For example, array shell or array frame configurations may be practiced, as well as array shell embodiments with shortened side walls. Different types of spacer ribs may be provided, such as connected spacer ribs, opposing spacer rib portions, or combinations thereof. Still further enhancements such as standoffs and particular mounting features may also be practiced in accordance with the present subject matter.

Examples of more particular exemplary embodiments of the present subject matter will now be discussed with reference to FIGS. 3A through 9E, respectively. Each exemplary receiving structure disclosed in such figures is designed for the receipt of standard 0402 size components (40 thousandths of an inch by 20 thousandths of an inch). A receiving structure for passive components with different standard component sizes may also be designed by appropriately adjusting the disclosed dimensions relative to the component size.

A receiving structure may also be designed to accommodate different linear and non-linear array configurations. For instance, even though particular dimensions are disclosed for a two-by-one array, a three-by-one array, a four-by-one array, a five-by-one array, a seven-by-one array, an eight-by-one array, and a five-by-two array, the disclosed dimensions could easily be altered to accommodate any particular array. Examples of other arrays may include a six-by-one array, a nine-by-one array, a ten-by-one array, a two-by-two array, a three-by-two array, a four-by-two array, a six-by-two array, a seven-by-two array, an eight-by-two array, a nine-by-two array, a ten-by-two array, a three-by-three array, a nine-by-three array, a ten-by-three array, etc.

It should also be appreciated that aspects of the disclosed array shells could easily be modified to incorporate other of the aforementioned disclosed features. For example, some opposing spacer rib portions could be substituted for connected spacer ribs, and vice versa. Also, the height of selected side walls could be adjusted in accordance with array shell versus array frame embodiments and embodiments with side wall heights somewhere in between.

FIG. 3A illustrates an exemplary two-by-one discrete capacitor array 44 with array shell receiving structure 46. The array shell 46 includes a base portion 48, a first set of longer opposing side walls 50, a second set of shorter opposing side walls 52a and 52b, and opposing spacer rib portions 54. Side walls 52a and 52b are generally higher than side walls 50 to facilitate selected of the aforementioned standoff advantages. A portion of side wall 52b as illustrated may be cut out to further aid in device cleaning and connection troubleshooting.

FIG. 3B provides a bottom view of the exemplary two-by-one discrete component array embodiment of FIG. 3A, with particular reference to exemplary dimensions. The distance 56 between opposing spacer rib portions 54 is preferably about twenty-five mils (thousandths of an inch). Thickness 58 of spacer rib portion 54 is preferably about ten mils. Distance 60 is preferably about twenty-five mils and distance 62 is preferably about sixty mils.

Figure 3D:
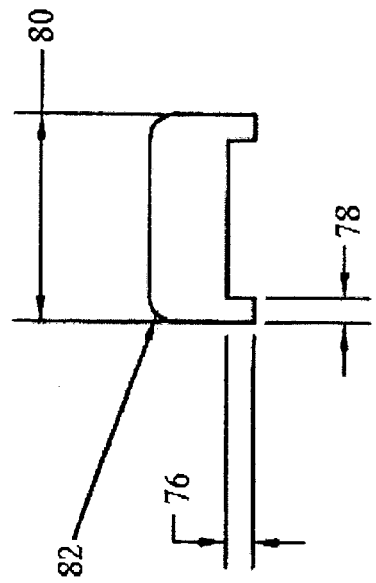
FIG. 3D provides a second side view of the exemplary two-by-one discrete component array embodiment of FIG. 3A.
Figure 3E:
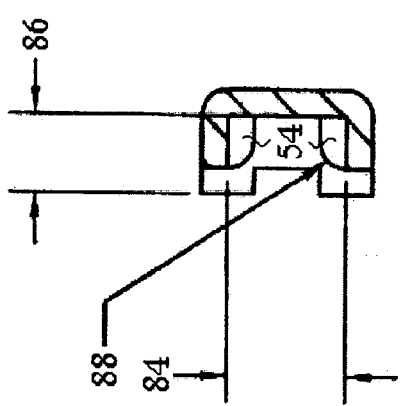
FIG. 3E provides a side sectional view of the exemplary two-by-one discrete component array embodiment of FIGS. 3A through 3D taken along planar section line A—A in FIG. 3B.
Figure 3C:
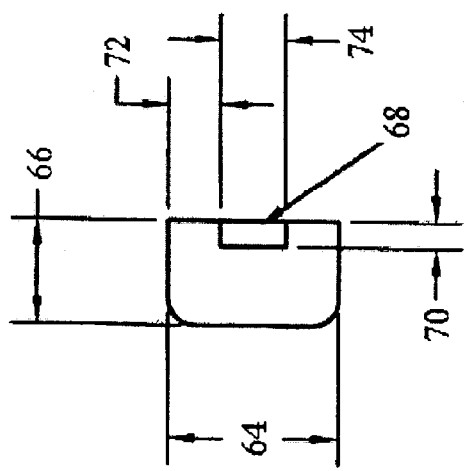
FIG. 3C provides a first side view of the exemplary two-by-one discrete component array embodiment of FIG. 3A.

FIG. 3C provides a first side view of the exemplary two-by-one discrete component array embodiment of FIG. 3A, with reference to exemplary dimensions for shorter side walls 52a and 52b. The length 64 of side walls 52a and 52b is preferably about sixty-five mils and the height 66 is preferably about fourty mils. Side wall 52b is identical to side wall 52a except that it has an extra notched section 68 removed from it such that dimension 70 is about ten mils, dimension 72 is about twenty mils, and dimension 74 is about twenty-five mils.

FIG. 3D provides a second side view of the exemplary two-by-one discrete component array embodiment of FIG. 3A, with reference to exemplary dimensions of longer side walls 50. Portion 76 is preferably about ten mils, portion 78 is preferably about ten mils, and portion 80 is preferably about eighty mils. Each corner 82 of this portion of array shell 44 is preferably rounded with a corner radius of about ten mils.

FIG. 3E provides a side sectional view of the exemplary two-by-one discrete component array embodiment of FIGS. 3A through 3D taken along planar section line A—A in FIG. 3B. Distance 84 is preferably about fourty-five mils, distance 86 is preferably about thirty mils, and rounded spacer rib portions 88 preferably have a corner radius of about ten mils.

Figure 4B:
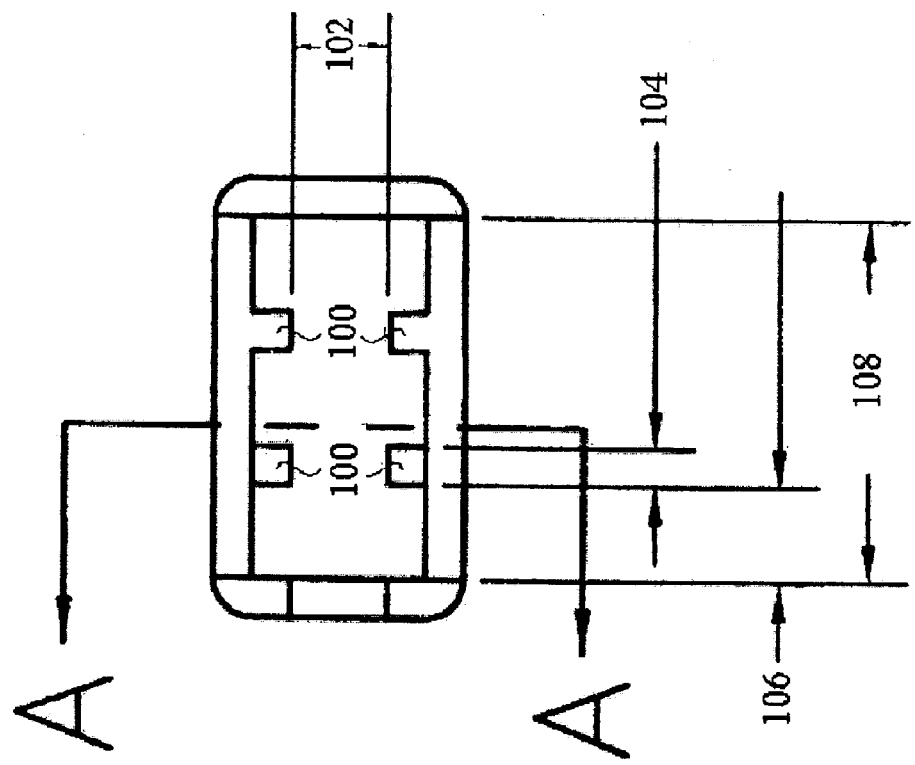
FIG. 4B provides a bottom view of the exemplary three-by-one discrete component array embodiment of FIG. 4A.
Figure 4A:
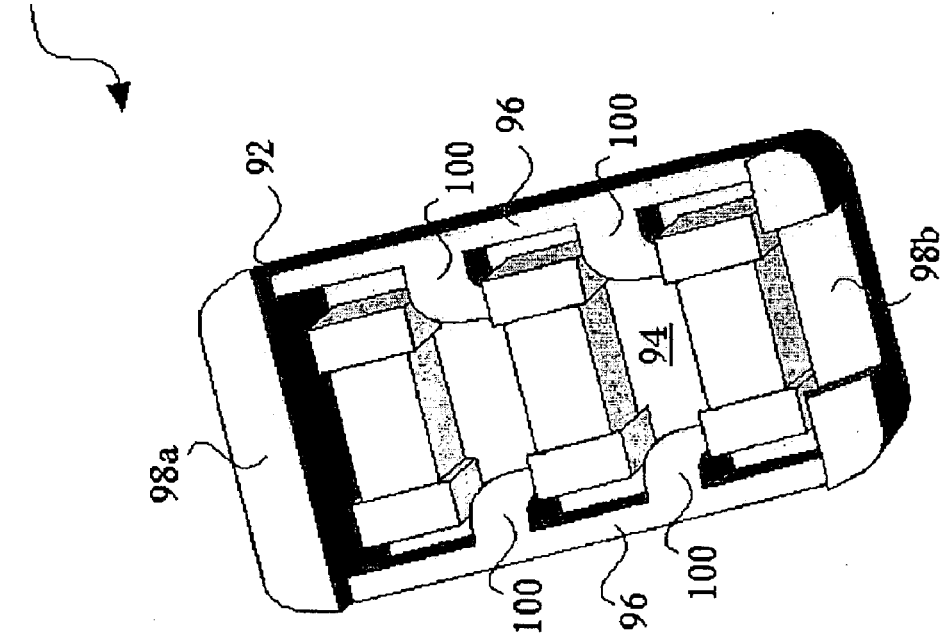
FIG. 4A provides an isometric view with generally bottom and slight side perspective of an exemplary three-by-one discrete component array embodiment in accordance with the disclosed technology.

FIG. 4A illustrates an exemplary three-by-one discrete capacitor array 90 with array shell receiving structure 92. The array shell 92 includes a base portion 94, a first set of longer opposing side walls 96, a second set of shorter opposing side walls 98a and 98b, and opposing spacer rib portions 100. Side walls 98a and 98b are generally higher than side walls 96 to facilitate selected of the aforementioned standoff advantages. A portion of side wall 98b as illustrated may be cut out to further aid in device cleaning and connection troubleshooting.

FIG. 4B provides a bottom view of the exemplary three-by-one discrete component array embodiment of FIG. 4A, with particular reference to exemplary dimensions. The distance 102 between opposing spacer rib portions 100 is preferably about twenty-five mils (thousandths of an inch). Thickness 104 of spacer rib portions 100 is preferably about ten mils. Distance 106 is preferably about twenty-five mils and distance 108 is preferably about ninety-five mils.

FIG. 4C provides a first side view of the exemplary three-by-one discrete component array embodiment of FIG. 4A, with reference to exemplary dimensions for shorter side walls 98a and 98b. The length 108 of side walls 98a and 98b is preferably about sixty-five mils and the height 110 is preferably about fourty mils. Side wall 98b is preferably identical to side wall 98a except that it has an extra notched section 112 removed from it such that dimension 114 is about ten mils, dimension 116 is about twenty mils, and dimension 118 is about twenty-five mils.

FIG. 4D provides a second side view of the exemplary three-by-one discrete component array embodiment of FIG. 4A, with reference to exemplary dimensions of longer side walls 96. Portion 120 is preferably about ten mils, portion 122 is preferably about ten mils, and portion 124 is preferably about one-hundred-fifteen mils. Each corner 126 of this portion of array shell 92 is preferably rounded with a corner radius of about ten mils.

FIG. 4E provides a side sectional view of the exemplary three-by-one discrete component array embodiment of FIGS. 4A through 4D taken along planar section line A—A in FIG. 4B. Distance 128 is preferably about fourty-five mils, distance 130 is preferably about thirty mils, and rounded spacer rib portions 132 preferably have a corner radius of about ten mils.

Figures 5A, 5B:
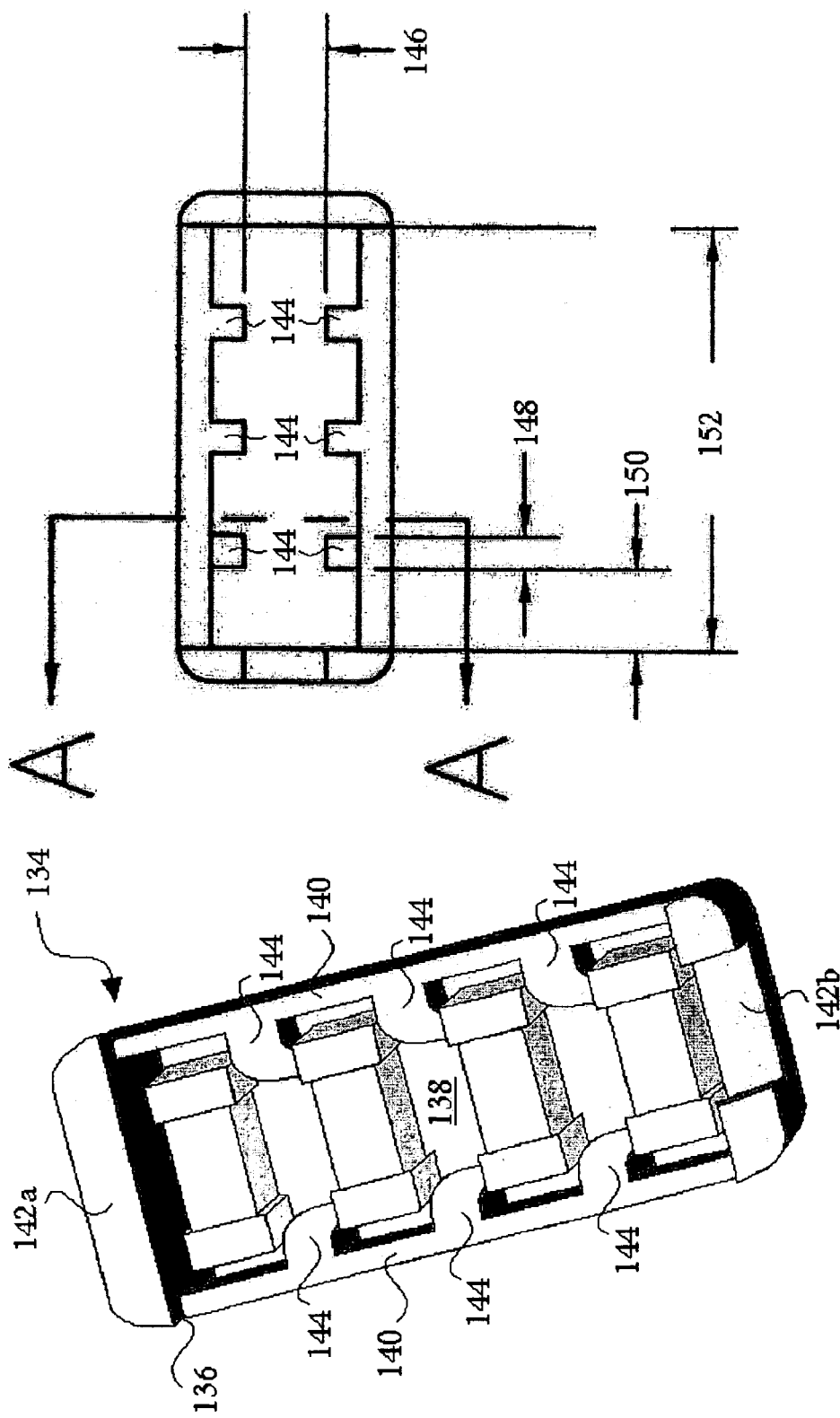
FIG. 5A provides an isometric view with generally bottom and slight side perspective of an exemplary four-by-one discrete component array embodiment in accordance with the disclosed technology.
FIG. 5B provides a bottom view of the exemplary four-by-one discrete component array embodiment of FIG. 5A.

FIG. 5A illustrates an exemplary four-by-one discrete capacitor array 134 with array shell receiving structure 136. The array shell 136 includes a base portion 138, a first set of longer opposing side walls 140, a second set of shorter opposing side walls 142a and 142b, and opposing spacer rib portions 144. Side walls 142a and 142b are generally higher than side walls 140 to facilitate selected of the aforementioned standoff advantages. A portion of side wall 142b as illustrated may be cut out to further aid in device cleaning and connection troubleshooting.

FIG. 5B provides a bottom view of the exemplary four-by-one discrete component array embodiment of FIG. 5A, with particular reference to exemplary dimensions. The distance 146 between opposing spacer rib portions 144 is preferably about twenty-five mils (thousandths of an inch). Thickness 148 of spacer rib portions 144 is preferably about ten mils. Distance 150 is preferably about twenty-five mils and distance 152 is preferably about one-hundred-thirty mils.

Figure 5D:
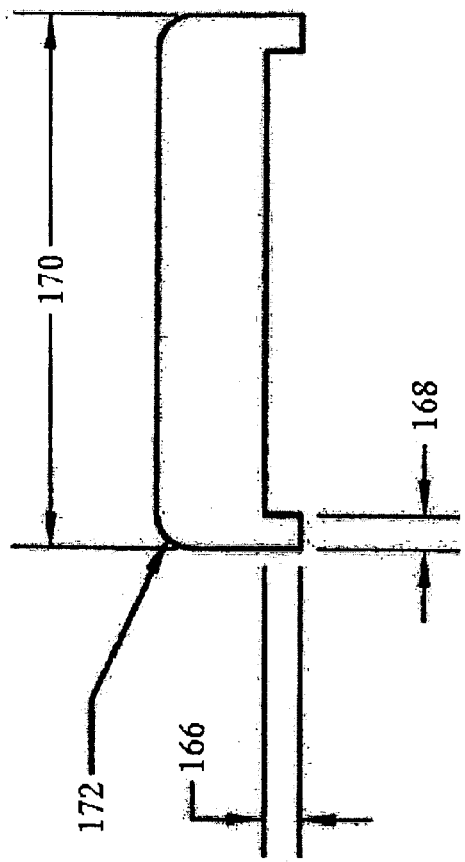
FIG. 5D provides a second side view of the exemplary four-by-one discrete component array embodiment of FIG. 5A.
Figure 5C:
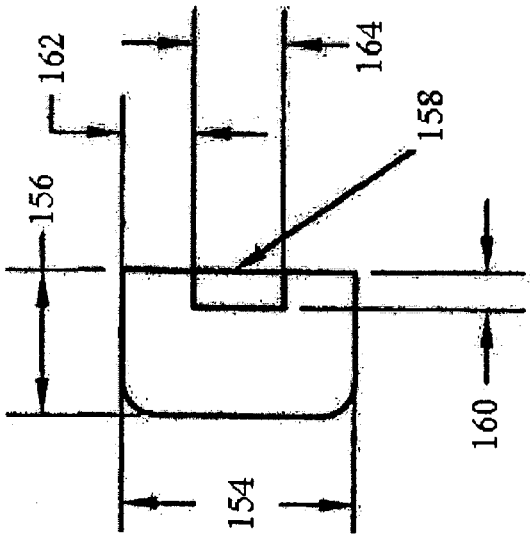
FIG. 5C provides a first side view of the exemplary four-by-one discrete component array embodiment of FIG. 5A.

FIG. 5C provides a first side view of the exemplary four-by-one discrete component array embodiment of FIG. 5A, with reference to exemplary dimensions for shorter side walls 142a and 142b. The length 154 of side walls 142a and 142b is preferably about sixty-five mils and the height 156 is preferably about fourty mils. Side wall 142b is preferably identical to side wall 142a except that it has an extra notched section 158 removed from it such that dimension 160 is about ten mils, dimension 162 is about twenty mils, and dimension 164 is about twenty-five mils.

FIG. 5D provides a second side view of the exemplary four-by-one discrete component array embodiment of FIG. 5A, with reference to exemplary dimensions of longer side walls 140. Portion 166 is preferably about ten mils, portion 168 is preferably about ten mils, and portion 170 is preferably about one-hundred-fifty mils. Each corner 172 of this portion of array shell 136 is preferably rounded with a corner radius of about ten mils.

Figure 5E:
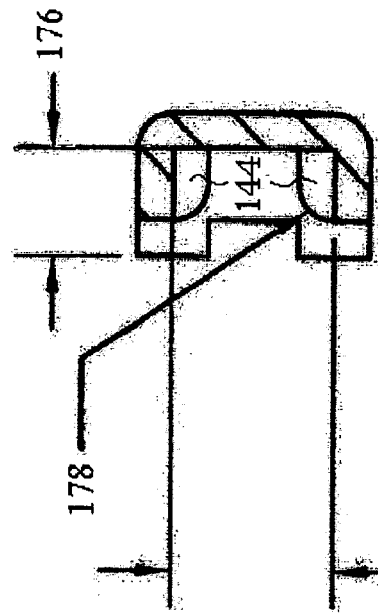
FIG. 5E provides a side sectional view of the exemplary four-by-one discrete component array embodiment of FIGS. 5A through 5D taken along planar section line A—A in FIG. 5B.

FIG. 5E provides a side sectional view of the exemplary four-by-one discrete component array embodiment of FIGS. 5A through 5D taken along planar section line A—A in FIG. 5B. Distance 174 is preferably about fourty-five mils, distance 176 is preferably about thirty mils, and rounded spacer rib portions 178 preferably have a corner radius of about ten mils.

FIG. 6A illustrates an exemplary five-by-one discrete capacitor array 180 with array shell receiving structure 182. The array shell 182 includes a base portion 184, a first set of longer opposing side walls 186, a second set of shorter opposing side walls 188a and 188b, and opposing spacer rib portions 190. Side walls 188a and 188b are generally higher than side walls 186 to facilitate selected of the aforementioned standoff advantages. A portion of side wall 188b as illustrated may be cut out to further aid in device cleaning and connection troubleshooting.

FIG. 6B provides a bottom view of the exemplary five-by-one discrete component array embodiment of FIG. 6A, with particular reference to exemplary dimensions. The distance 192 between opposing spacer rib portions 190 is preferably about twenty-five mils (thousandths of an inch). Thickness 194 of spacer rib portions 190 is preferably about ten mils. Distance 196 is preferably about twenty-five mils and distance 198 is preferably about one-hundred-sixty-five mils.

FIG. 6C provides a first side view of the exemplary five-by-one discrete component array embodiment of FIG. 6A, with reference to exemplary dimensions for shorter side walls 188a and 188b. The length 200 of side walls 188a and 188b is preferably about sixty-five mils and the height 202 is preferably about fourty mils. Side wall 188b is preferably identical to side wall 188a except that it has an extra notched section 204 removed from it such that dimension 206 is about ten mils, dimension 208 is about twenty mils, and dimension 210 is about twenty-five mils.

FIG. 6D provides a second side view of the exemplary five-by-one discrete component array embodiment of FIG. 6A, with reference to exemplary dimensions of longer side walls 186. Portion 212 is preferably about ten mils, portion 214 is preferably about ten mils, and portion 216 is preferably about one-hundred-eighty-five mils. Each corner 218 of this portion of array shell 182 is preferably rounded with a corner radius of about ten mils.

FIG. 6E provides a side sectional view of the exemplary five-by-one discrete component array embodiment of FIGS. 6A through 6D taken along planar section line A—A in FIG. 6B. Distance 220 is preferably about fourty-five mils, distance 222 is preferably about thirty mils, and rounded spacer rib portions 224 preferably have a corner radius of about ten mils.

FIG. 7A illustrates an exemplary seven-by-one discrete capacitor array 226 with array shell receiving structure 228. The array shell 228 includes a base portion 230, a first set of longer opposing side walls 232, a second set of shorter opposing side walls 234a and 234b, and opposing spacer rib portions 236. Side walls 234a and 234b are generally higher than side walls 232 to facilitate selected of the aforementioned standoff advantages. A portion of side wall 234b as illustrated may be cut out to further aid in device cleaning and connection troubleshooting.

FIG. 7B provides a bottom view of the exemplary seven-by-one discrete component array embodiment of FIG. 7A, with particular reference to exemplary dimensions. The distance 238 between opposing spacer rib portions 236 is preferably about twenty-five mils (thousandths of an inch). Thickness 240 of spacer rib portions 236 is preferably about ten mils. Distance 242 is preferably about twenty-five mils and distance 244 is preferably about two-hundred-thirty-five mils.

Figure 7E:
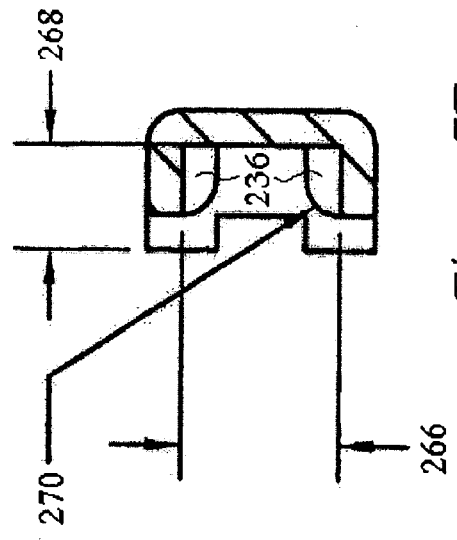
FIG. 7E provides a side sectional view of the exemplary seven-by-one discrete component array embodiment of FIGS. 7A through 7D taken along planar section line A—A in FIG. 7B.
Figure 7C:
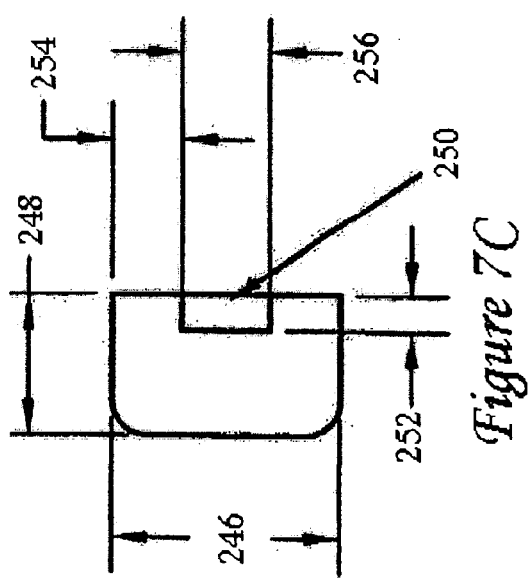
FIG. 7C provides a first side view of the exemplary seven-by-one discrete component array embodiment of FIG. 7A.

FIG. 7C provides a first side view of the exemplary seven-by-one discrete component array embodiment of FIG. 7A, with reference to exemplary dimensions for shorter side walls 234a and 234b. The length 246 of side walls 234a and 234b is preferably about sixty-five mils and the height 248 is preferably about fourty mils. Side wall 234b is preferably identical to side wall 234a except that it has an extra notched section 250 removed from it such that dimension 252 is about ten mils, dimension 254 is about twenty mils, and dimension 256 is about twenty-five mils.

Figure 7D:
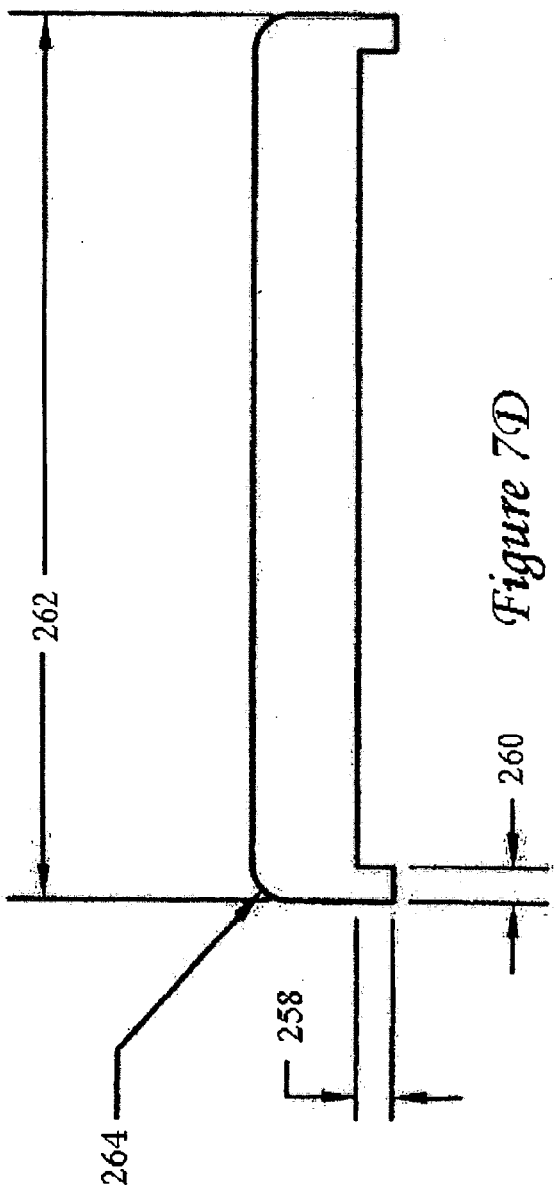
FIG. 7D provides a second side view of the exemplary seven-by-one discrete component array embodiment of FIG. 7A.

FIG. 7D provides a second side view of the exemplary seven-by-one discrete component array embodiment of FIG. 7A, with reference to exemplary dimensions of longer side walls 232. Portion 258 is preferably about ten mils, portion 260 is preferably about ten mils, and portion 262 is preferably about two-hundred-fifty-five mils. Each corner 264 of this portion of array shell 228 is preferably rounded with a corner radius of about ten mils.

FIG. 7E provides a side sectional view of the exemplary seven-by-one discrete component array embodiment of FIGS. 7A through 7D taken along planar section line A—A in FIG. 7B. Distance 266 is preferably about fourty-five mils, distance 268 is preferably about thirty mils, and rounded spacer rib portions 270 preferably have a corner radius of about ten mils.

Figure 8A:
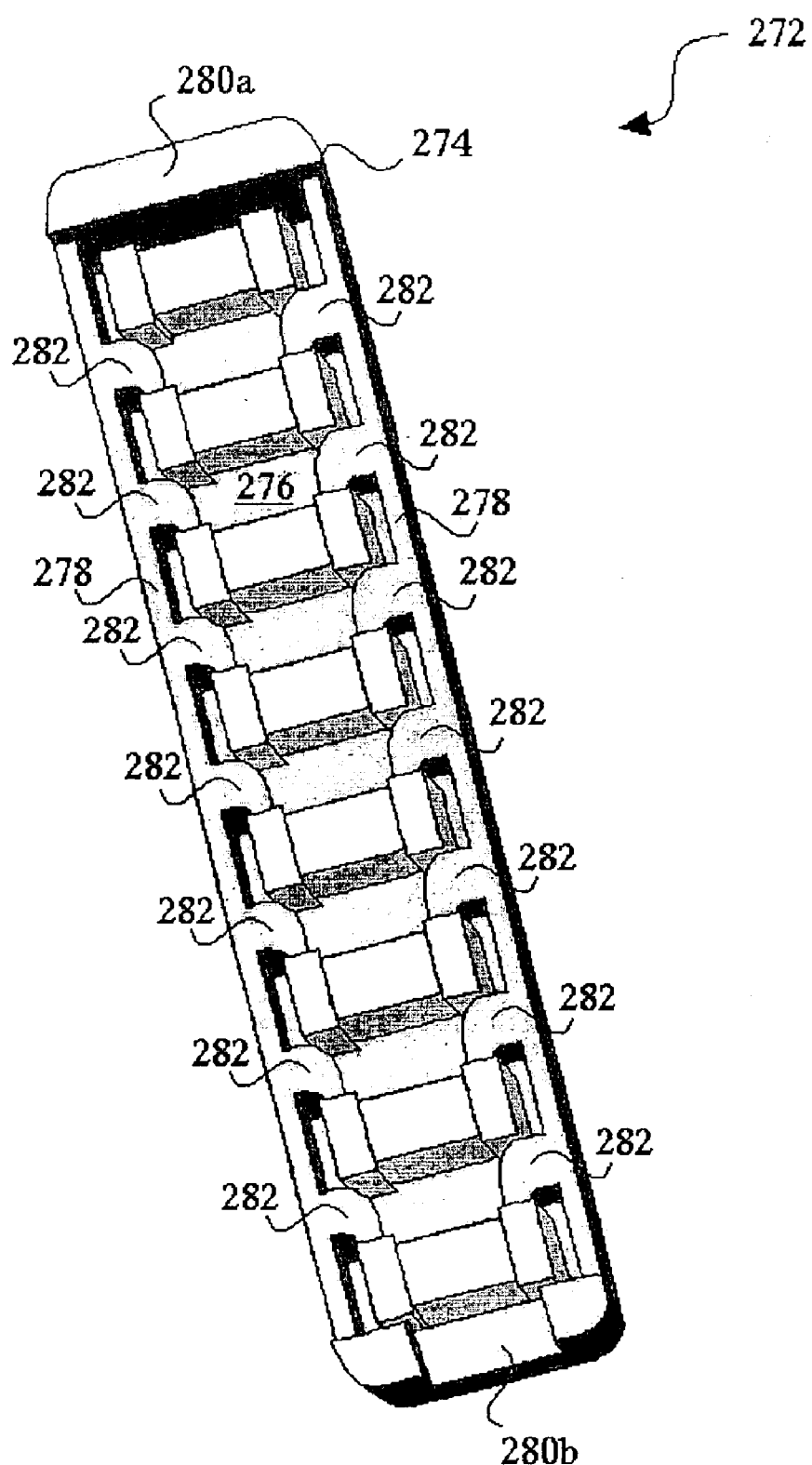
FIG. 8A provides an isometric view with generally bottom and slight side perspective of an exemplary eight-by-one discrete component array embodiment in accordance with the disclosed technology.

FIG. 8A illustrates an exemplary eight-by-one discrete capacitor array 272 with array shell receiving structure 274. The array shell 274 includes a base portion 276, a first set of longer opposing side walls 278, a second set of shorter opposing side walls 280a and 280b, and opposing spacer rib portions 282. Side walls 280a and 280b are generally higher than side walls 278 to facilitate selected of the aforementioned standoff advantages. A portion of side wall 280b as illustrated may be cut out to further aid in device cleaning and connection troubleshooting.

Figure 8B:
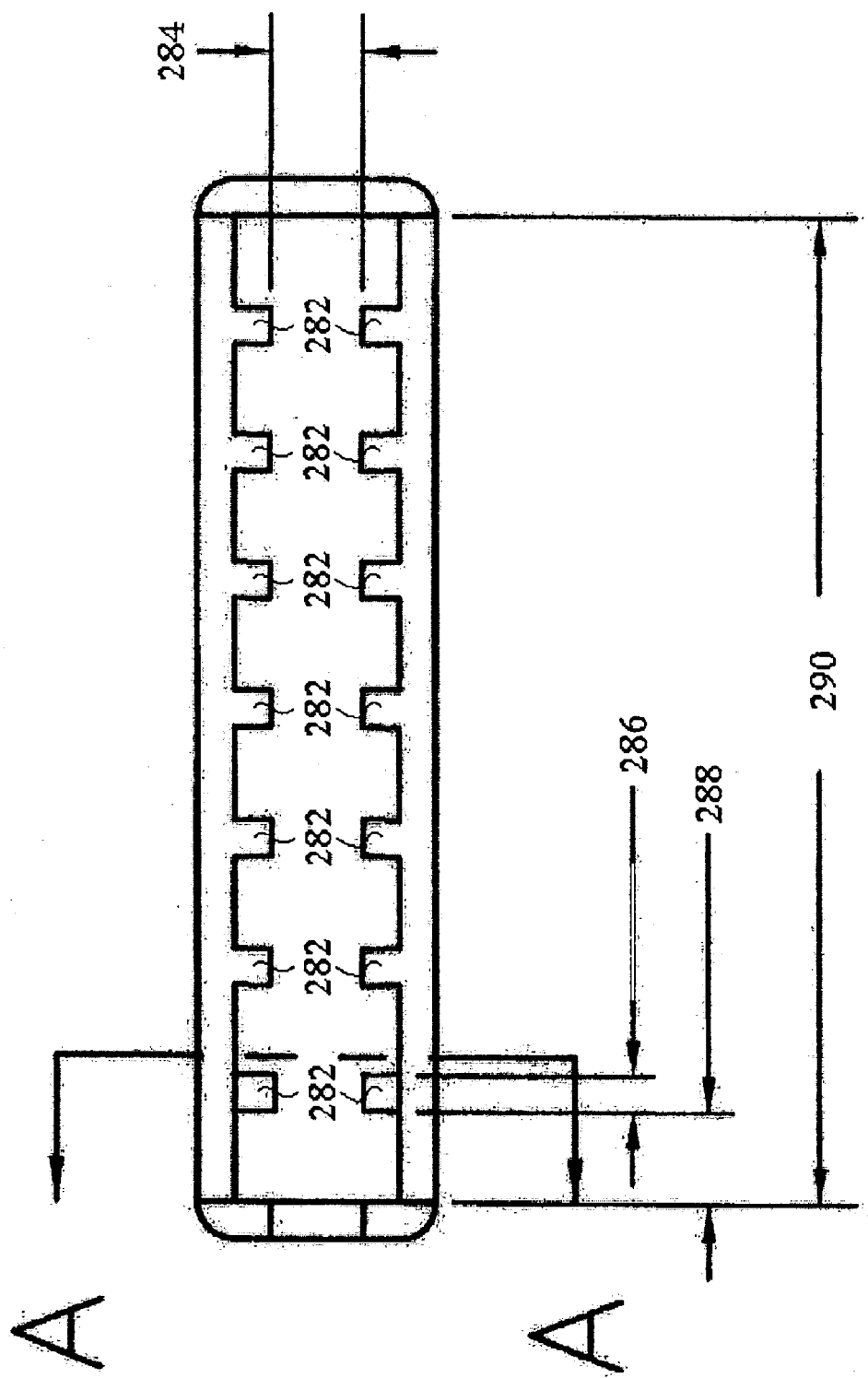
FIG. 8B provides a bottom view of the exemplary eight-by-one discrete component array embodiment of FIG. 8A.

FIG. 8B provides a bottom view of the exemplary eight-by-one discrete component array embodiment of FIG. 8A, with particular reference to exemplary dimensions. The distance 284 between opposing spacer rib portions 282 is preferably about twenty-five mils (thousandths of an inch). Thickness 286 of spacer rib portions 282 is preferably about ten mils. Distance 288 is preferably about twenty-five mils and distance 290 is preferably about two-hundred-seventy mils.

FIG. 8C provides a first side view of the exemplary eight-by-one discrete component array embodiment of FIG. 8A, with reference to exemplary dimensions for shorter side walls 280a and 280b. The length 292 of side walls 280a and 280b is preferably about sixty-five mils and the height 294 is preferably about forty mils. Side wall 280b is preferably identical to side wall 280a except that it has an extra notched section 296 removed from it such that dimension 298 is about ten mils, dimension 300 is about twenty mils, and dimension 302 is about twenty-five mils.

FIG. 8D provides a second side view of the exemplary eight-by-one discrete component array embodiment of FIG. 8A, with reference to exemplary dimensions of longer side walls 278. Portion 304 is preferably about ten mils, portion 306 is preferably about ten mils, and portion 308 is preferably about two-hundred-ninety mils. Each corner 310 of this portion of array shell 272 is preferably rounded with a corner radius of about ten mils.

FIG. 8E provides a side sectional view of the exemplary eight-by-one discrete component array embodiment of FIGS. 8A through 8D taken along planar section line A—A in FIG. 8B. Distance 312 is preferably about forty-five mils, distance 314 is preferably about thirty mils, and rounded spacer rib portions 316 preferably have a corner radius of about ten mils.

Figure 9A:
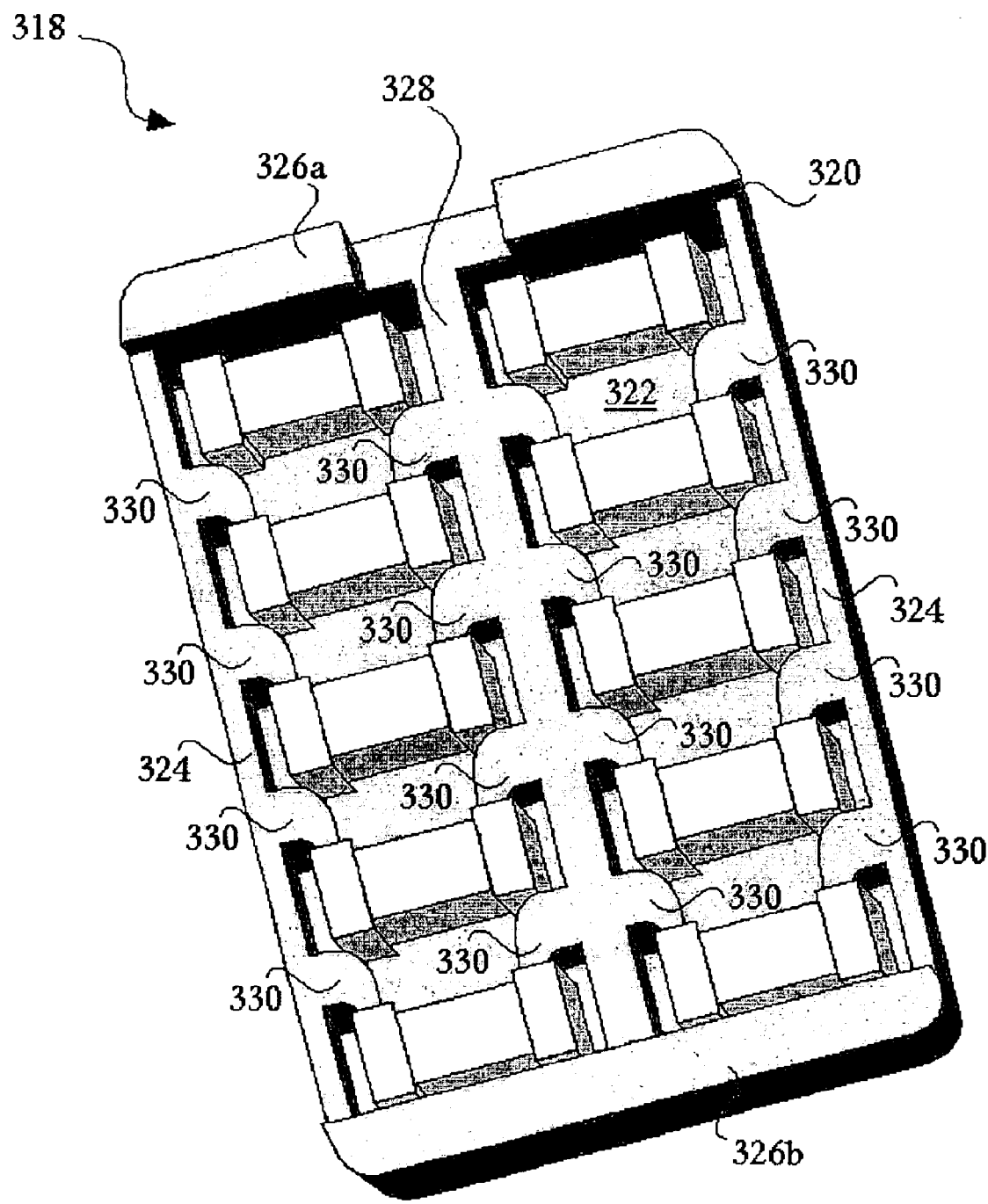
FIG. 9A provides an isometric view with generally bottom and slight side perspective of an exemplary five-by-two discrete component array embodiment in accordance with the disclosed technology.

FIG. 9A illustrates an exemplary five-by-two discrete capacitor array 318 with array shell receiving structure 320. The array shell 320 includes a base portion 322, a first set of longer opposing side walls 324, a second set of shorter opposing side walls 326a and 326b, connected spacer rib 328 and opposing spacer rib portions 330. Side walls 326a and 326b are generally higher than side walls 324 to facilitate selected of the aforementioned standoff advantages. A portion of side wall 326a as illustrated may be cut out to further aid in device cleaning and connection troubleshooting.

Figure 9B:
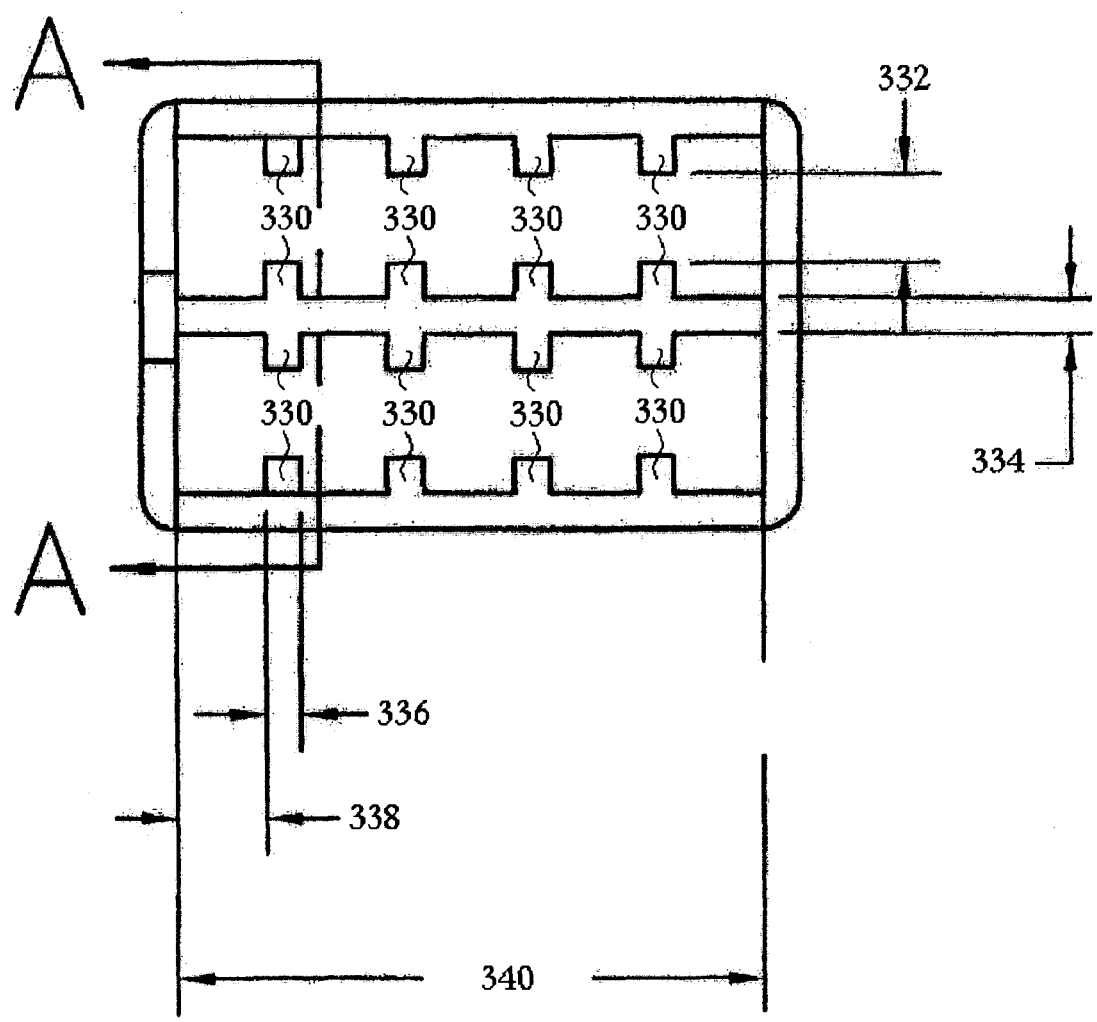
FIG. 9B provides a bottom view of the exemplary five-by-two discrete component array embodiment of FIG. 9A.

FIG. 9B provides a bottom view of the exemplary five-by-two discrete component array embodiment of FIG. 9A, with particular reference to exemplary dimensions. The distance 332 between opposing spacer rib portions 330 is preferably about twenty-five mils (thousandths of an inch). Thickness 334 of connected spacer rib 328 is preferably about ten mils, and thickness 336 of spacer rib portions 330 is preferably about ten mils. Distance 338 is preferably about twenty-five mils and distance 340 is preferably about one-hundred-sixty-five mils.

Figure 9C:
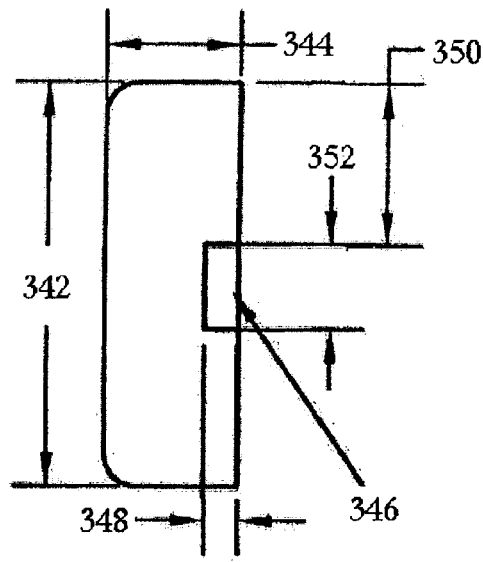
FIG. 9C provides a first side view of the exemplary five-by-two discrete component array embodiment of FIG. 9A.

FIG. 9C provides a first side view of the exemplary five-by-two discrete component array embodiment of FIG. 9A, with reference to exemplary dimensions for shorter side walls 326a and 326b. The length 342 of side walls 326a and 326b is preferably about one-hundred-twenty mils and the height 344 is preferably about forty mils. Side wall 326b is preferably identical to side wall 326a except that it has an extra notched section 346 removed from it such that dimension 348 is about ten mils, dimension 350 is about forty-seven mils, and dimension 352 is about twenty-five mils.

Figure 9E:
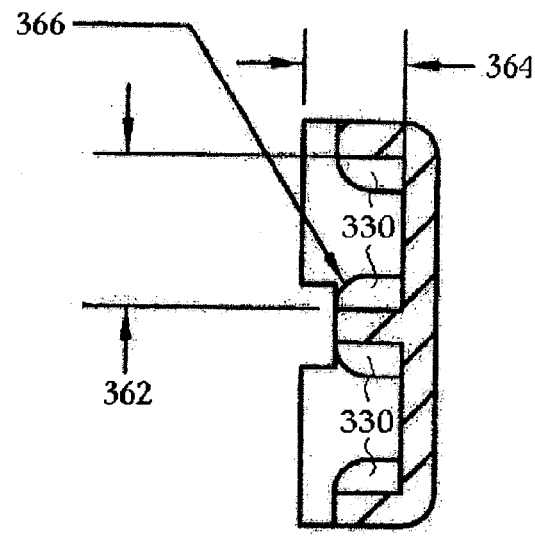
FIG. 9E provides a side sectional view of the exemplary five-by-two discrete component array embodiment of FIGS. 9A through 9D taken along planar section line A—A in FIG. 9B.
Figure 9D:
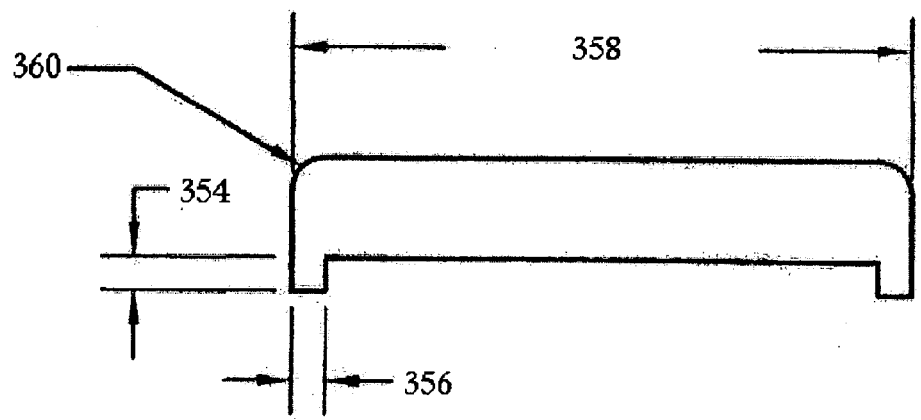
FIG. 9D provides a second side view of the exemplary five-by-two discrete component array embodiment of FIG. 9A.

FIG. 9D provides a second side view of the exemplary five-by-two discrete component array embodiment of FIG. 9A, with reference to exemplary dimensions of longer side walls 324. Portion 354 is preferably about ten mils, portion 356 is preferably about ten mils, and portion 358 is preferably about one-hundred-eighty-five mils. Each corner 360 of this portion of array shell 320 is preferably rounded with a corner radius of about ten mils.

FIG. 9E provides a side sectional view of the exemplary five-by-two discrete component array embodiment of FIGS. 9A through 9D taken along planar section line A—A in FIG. 9B. Distance 362 is preferably about fourty-five mils, distance 364 is preferably about thirty mils, and rounded side rib portions 366 preferably have a corner radius of about ten mils.

While the present subject matter has been described in detail with respect to specific embodiments thereof, it will be appreciated that those skilled in the art, upon attaining an understanding of the foregoing, may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed:

1. An array shell for receiving a plurality of discrete electronic components and for providing mechanical protection for and isolation among such electronic components, said array shell comprising:
   a generally planar base portion;
   a plurality of side walls extending from the periphery of said base portion in a generally perpendicular direction relative to said base portion, said plurality of side walls respectively characterized by interior and exterior surfaces; and
   a plurality of spacer ribs extending from selected locations along selected of the respective interior surfaces of said plurality of side walls; and
   a plurality of standoff extensions provided at selected locations along said plurality of side walls and said plurality of spacer ribs.

2. An array shell as in claim 1, wherein said base portion is provided in a generally rectangular configuration.

3. An array shell as in claim 2, wherein said plurality of side walls extend completely around the periphery of said base portion to form in conjunction with said base portion an open box type configuration.

4. An array shell as in claim 2, wherein each said spacer rib is generally parallel to two side walls of the array shell.

5. An array shell as in claim 1, wherein selected of said spacer ribs span an entire dimension of said array shell by connecting from the interior surface of a selected side wall to the interior surface of the sidewall opposing said selected side wall.

6. An array shell as in claim 1, wherein said plurality of side walls and said plurality of spacer ribs are positioned relative to one another to define a plurality of discrete receiving locations for a respective plurality of electronic components.

7. An array shell as in claim 1, wherein selected of said spacer ribs correspond to opposing spacer rib portions that do not span an entire dimension of said array shell.

8. An array frame for receiving and providing separation among discrete electronic components, said array frame comprising:
   a base portion; and
   a plurality of spacer ribs extending from said base portion in a generally perpendicular direction relative to said base portion, said plurality of spacer ribs oriented to form a grid-like configuration;
   wherein said base portion and said plurality of spacer ribs are positioned relative to one another to define a plurality of discrete receiving locations for a respective plurality of electronic components, said discrete receiving locations configured to ensure visual contact for at least two adjacent surfaces of each electronic component potentially mounted therein.

9. An array frame as in claim 8, wherein said base portion is provided in a generally rectangular configuration.

10. An array frame as in claim 9, wherein selected of said spacer ribs span an entire length or width dimension of said generally rectangular base portion.

11. An array frame as in claim 8, further comprising a plurality of standoff extensions provided at selected locations along said plurality of spacer ribs.

12. An array frame as in claim 8, wherein selected of said spacer ribs correspond to opposing spacer rib portions that do not span an entire dimension of said array shell.

13. A discrete capacitor array, comprising:
   a mechanical receiving structure, including:
      a base portion; and
      a plurality of spacer ribs extending from said base portion in a generally perpendicular direction relative to said base portion, wherein selected of said spacer ribs correspond to opposing spacer rib portions that do not span an entire dimension of said mechanical receiving structure;
      wherein said base portion and said plurality of spacer ribs are positioned relative to one another to define a plurality of discrete receiving locations; and
   a plurality of discrete capacitors positioned within selected of the discrete receiving locations defined by said mechanical receiving structure, whereby said mechanical receiving structure provides isolation among and structural protection for said plurality of discrete capacitors.

14. A discrete capacitor array as in claim 13, further comprising a plurality of epoxy attachment layers respectively provided between said plurality of discrete capacitors and said mechanical receiving structure to securely position said discrete capacitors therein.

15. A discrete capacitor array as in claim 13, wherein each discrete capacitor in said plurality of discrete capacitors is either a multilayer ceramic capacitor or an electrolytic capacitor.

16. A discrete capacitor array as in claim 13, wherein said base portion is provided in a generally rectangular configuration.

17. A discrete capacitor array as in claim 16, wherein selected of said spacer ribs span an entire length or width dimension of said generally rectangular base portion.

18. A discrete capacitor array as in claim 13, wherein said mechanical receiving structure further includes a plurality of side walls extending from the periphery of said base portion in a generally perpendicular direction relative to said base portion, said plurality of side walls respectively characterized by interior and exterior surfaces, and wherein said plurality of spacer ribs extends from selected locations along selected of the respective interior surfaces of said plurality of side walls.

19. A discrete capacitor array as in claim 18, wherein said plurality of side walls extend completely around the periphery of said base portion to form in conjunction with said base portion on open container type configuration.

20. A discrete capacitor array as in claim 18, wherein said base portion is provided in a generally rectangular configuration and wherein each said spacer rib is generally parallel to two side walls of said mechanical receiving structure.

21. A discrete capacitor array as in claim 18, further comprising a plurality of standoff extensions provided at selected locations along said plurality of side walls and said plurality of spacer ribs.

22. A discrete capacitor array as in claim 13, wherein each capacitor of said plurality of discrete capacitors is positioned within said mechanical receiving structure such that at least one termination location is exposed, and wherein said discrete capacitor array further comprises a plurality of affixment features for attaching selected of the exposed termination features to a mounting location.

23. An electronic assembly, comprising:
   a mechanical receiving structure, including:
      a base portion; and
      a plurality of spacer ribs extending from said base portion in a generally perpendicular direction relative to said base portion;
      wherein said base portion and said plurality of spacer ribs are positioned relative to one another to define a plurality of discrete receiving locations; and
   a plurality of discrete passive components positioned within selected of the discrete receiving locations defined by said mechanical receiving structure, whereby said mechanical receiving structure provides isolation among and structural protection for said plurality of discrete passive components; and
   at least one epoxy attachment layer provided between said plurality of discrete passive components and said mechanical receiving structure to securely position said discrete passive components therein.

24. An electronic assembly as in claim 23, wherein each discrete passive component in said plurality of discrete passive components is selected from the group consisting of capacitors, resistors and inductors.

25. An electronic assembly as in claim 23, wherein said base portion is provided in a generally rectangular configuration.

26. An electronic assembly as in claim 25, wherein selected of said spacer ribs span an entire length or width dimension of said generally rectangular base portion.

27. An electronic assembly as in claim 23, wherein said mechanical receiving structure further includes a plurality of side walls extending from the periphery of said base portion in a generally perpendicular direction relative to said base portion, said plurality of side walls respectively characterized by interior and exterior surfaces, and wherein said plurality of spacer ribs extends from selected locations along selected of the respective interior surfaces of said plurality of side walls.

28. An electronic assembly as in claim 27, wherein said plurality of side walls extend completely around the periphery of said base portion to form in conjunction with said base portion on open container type configuration.

29. An electronic assembly as in claim 27, wherein said base portion is provided in a generally rectangular configuration and wherein each said spacer rib is generally parallel to two side walls of said mechanical receiving structure.

30. An electronic assembly as in claim 27, further comprising a plurality of standoff extensions provided at selected locations along said plurality of side walls and said plurality of spacer ribs.

31. An electronic assembly as in claim 23, wherein each passive component of said plurality of discrete capacitors is positioned within said mechanical receiving structure such that at least one termination location is exposed, and wherein said electronic assembly further comprises a plurality of affixment features for attaching selected of the exposed termination features to a mounting location.

32. An electronic assembly as in claim 23, wherein selected of said spacer ribs correspond to opposing spacer rib portions that do not span an entire dimension of said array shell.

* * * * *